United States Patent
Tanaka et al.

(10) Patent No.: US 7,509,566 B2
(45) Date of Patent: *Mar. 24, 2009

(54) FLASH MEMORY

(75) Inventors: Tomoharu Tanaka, Yokohama (JP); Noboru Shibata, Yokohama (JP); Toru Tanzawa, Ebina (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/747,225

(22) Filed: May 10, 2007

(65) Prior Publication Data

US 2007/0223277 A1 Sep. 27, 2007

Related U.S. Application Data

(62) Division of application No. 10/601,636, filed on Jun. 24, 2003, now Pat. No. 7,219,285, which is a division of application No. 09/604,692, filed on Jun. 27, 2000, now Pat. No. 6,611,938.

(30) Foreign Application Priority Data

Jun. 28, 1999 (JP) .................................. 11181874

(51) Int. Cl.
*H03M 13/00* (2006.01)
*G11C 29/00* (2006.01)
*G11C 11/34* (2006.01)

(52) U.S. Cl. .................... 714/785; 714/718; 365/185.33

(58) Field of Classification Search ................. 714/731, 714/746, 718, 784, 762, 710, 785; 365/185.33, 365/201, 200

See application file for complete search history.

(56) References Cited

U.S. PATENT DOCUMENTS 4,646,312 A 2/1987 Goldsbury et al.

(Continued)

FOREIGN PATENT DOCUMENTS

EP 0 509 485 A1 10/1992

(Continued)

OTHER PUBLICATIONS

Toru Tanzawa et al., "A Compact On-Chip ECC for Low Cost Flash Memories," IEEE Journal of Solid-State Circuits, vol. 32, No. 5, May 1997.

(Continued)

*Primary Examiner*—Phung M Chung
(74) *Attorney, Agent, or Firm*—Banner & Witcoff, Ltd

(57) ABSTRACT

A flash memory includes a memory sector, a command interface, a first signal buffer, a control signal generation circuit, a data input buffer, an error correction circuit, an address buffer, an address signal generation circuit, a plurality of data memory circuits, and write circuit. The command interface receives a write data input instruction from an external device to generate a write data input instruction signal, and receives a write instruction from the external device to generate a write instruction signal. The error correction circuit is activated by the write data input instruction signal to receive the write data in synchronization with the write enable signal, and is activated by the write instruction signal to generate a check data for an error correction in synchronization with the control signal.

8 Claims, 25 Drawing Sheets

U.S. PATENT DOCUMENTS

| | | | |
|---|---|---|---|
| 4,706,249 | A | 11/1987 | Nakagawa et al. |
| 5,337,317 | A | 8/1994 | Takamisawa et al. |
| 5,603,001 | A | 2/1997 | Sukegawa et al. |
| 5,621,682 | A | 4/1997 | Tanzawa et al. |
| 5,719,888 | A | 2/1998 | Tanzawa et al. |
| 5,793,724 | A | 8/1998 | Ichikawa et al. |
| 5,793,943 | A | 8/1998 | Noll |
| 5,864,569 | A | 1/1999 | Roohparvar |
| 5,901,152 | A | 5/1999 | Tanaka et al. |
| 5,920,578 | A * | 7/1999 | Zook .................. 714/755 |
| 5,933,436 | A | 8/1999 | Tanzawa et al. |
| 5,996,108 | A | 11/1999 | Tanzawa et al. |
| 6,048,090 | A * | 4/2000 | Zook .................. 714/755 |
| 6,360,346 | B1 * | 3/2002 | Miyauchi et al. ........ 714/763 |
| 6,360,347 | B1 | 3/2002 | Walters, Jr. |
| 6,904,400 | B1 | 6/2005 | Peri et al. |

FOREIGN PATENT DOCUMENTS

| | | |
|---|---|---|
| EP | 0 082 540 A2 | 10/1997 |
| JP | 10-207726 A | 8/1998 |
| JP | 05-298895 | 11/1999 |
| WO | 96/29704 | 9/1996 |
| WO | 98/10425 | 3/1998 |
| WO | 98 33112 | 7/1998 |

OTHER PUBLICATIONS

European Search Report dated Aug. 27, 2004 in Application No. EP 04 01 1269.

Notification of the First Office Action dated Oct. 10, 2003 in Application No. 00119249.3.

Office Action of Oct. 23, 2007, in Japanese application 1999-181874. (No English translation).

\* cited by examiner

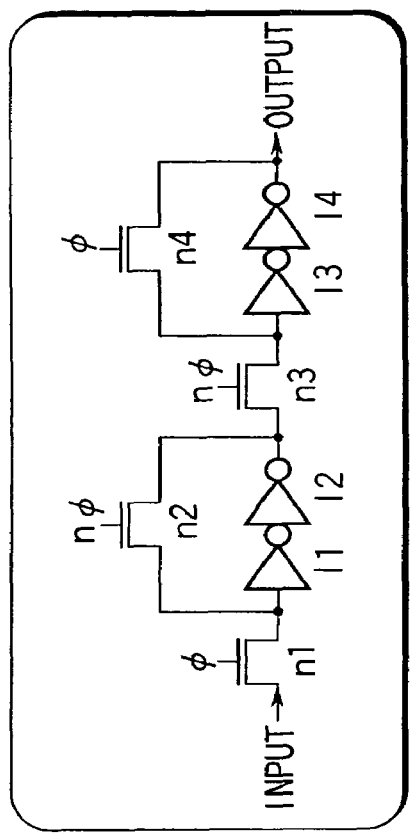
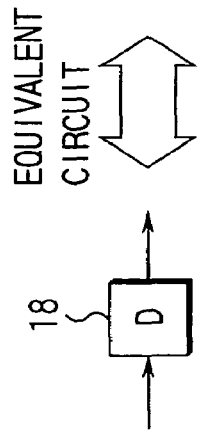
FIG.5A
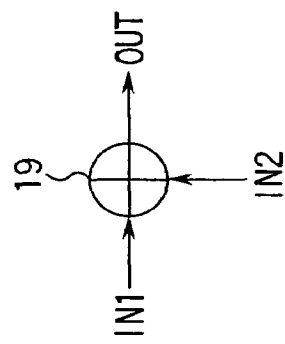
FIG.5B

FLASH MEMORY

CROSS-REFERENCE TO RELATED APPLICATIONS

This application is a Divisional of U.S. application Ser. No. 10/601,636 filed Jun. 24, 2003, which is a Divisional of U.S. application Ser. No. 09/604,692 filed on Jun. 27, 2000, which is based upon and claims the benefit of priority from the prior Japanese Patent Application No. 11-181874, filed Jun. 28, 1999, the entire contents of which are incorporated herein by reference.

BACKGROUND OF THE INVENTION

The present invention relates to a flash memory, especially, to a flash memory, which comprises an error correction circuit and has high reliability, and to a flash memory used for such as NAND type flash memory and NOR type flash memory.

Among the nonvolatile semiconductor memories, the flash memory can electrically erase and rewrite data for a comparatively large unit. Then, the flash memory is applied to the memory of BIOS (basic I/O system) in the computer system, the memory of the communication rule etc. in a portable telephone, and the memory of the image in the digital camera, etc. as substitution of the hard disk drive. Therefore, when only one bit error is occurred in the data memorized in the flash memory, crash of the computer system, disable of communication of a portable telephone and destroy of data will be occurred.

Then, when high reliability is required to the system, to which the flash memory is applied, the following function is provided for the system, which manages the flash memory. That is, the function is a function to write into the flash memory by adding the check data to the information data to be memorized so as to be able to detect and correct error, to read the information data and the check data and check if the error exists in the information data, and to correct the error when there is an error.

However, there are many cases that the methods of the error correction are different for each system, which manages the flash memories. For example, if the check data is different or the data length is different, the following disadvantages will be caused. That is, when the data written by a certain system A is read with another system B, even when there is no error in data, correct data is changed as it is assumed that data has an error, misdetection of error which is not able to be corrected, as a result, the destruction of data in the system will occur.

On the other hand, there is a method of equipping the error correction circuit in the flash memory. This method is valid, since this method performs the error correction in the flash memory without depending on the system.

However, since the error correction circuit is complex and the area of the circuit becomes large, the size of the chip of the flash memory becomes large, as a result, the high cost will be caused. On the other hand, the increase of the area of the circuit is suppressed for example by sharing the data memory circuit for reading and writing in part of the error correction circuit in U.S. Pat. No. 5,933,436.

In the flash memory in recent years, the multi-level memory to memorize the data of one or more bits in one memory cell is appeared. However, in the flash memory of the multi-level memory, when one memory cell destroys, the error is caused in the data of two or more bits (that is, the burst error is caused).

To correct such a burst error efficiently by short check data, though there is a method of the error correction based on the Reed-Solomon code, a complex circuit is required to specify the error, the area of the circuit becomes large, the size of the chip of the flash memory becomes large, and the high cost will be caused. On the other hand, in U.S. Pat. No. 5,621,682 and U.S. Pat. No. 5,719,888, the error correction of the multi-level flash memory is performed by the method of the error correction of each bit, and the data of two or more bits written in one memory cell at the same time is relieved by the plurality of check data.

As mentioned above, though the technology of equipping the error correction circuit in the flash memory exists previously, the following flash memory, which comprises the error correction circuit and considers benefits and convenience on practical use, has not been found. For example, (1) The flash memory, which has interchangeability with flash memory, which conventional error correction circuit is not equipped,
(2) The flash memory, which shortens the time required to specify detection and the error in error,
(3) The flash memory, which shortens the time required to generate check data,
(4) The flash memory, which prevents harm by error correction circuit from being generated when failure analysis is performed in the product test etc., and
(5) The flash memory, which prevents harm by circuit of error correction in the memory from being generated, when error correction is performed on application system side of the flash memory.

BRIEF SUMMARY OF THE INVENTION

An object of the present invention is to provide the following flash memories.
(1) The flash memory, which can secure interchangeability with a conventional flash memory, which does not comprise error correction circuit.
(2) The flash memory, which can shorten an appearance read time and can shorten an average read time by shortening the time required to detect an error and to specify the error.
(3) The flash memory, which can shorten an appearance write time by shortening the time required to generate check data.
(4) The flash memory to be able to prevent harm from being generated when failure analysis is performed in the product test etc.
(5) The flash memory, which can correctly perform the error correction even when additional information data is written into the memory cell by the flash memory management system.
(6) The flash memory, which can correctly perform error correction without depending on information data length, and can prevent harm from being generated by the error correction circuit equipped in memory when error correction is performed on application system side.
(7) The flash memory, which can select activation or deactivation of the error correction circuit equipped internally and can easily perform failure analysis.
(8) The flash memory, which can commonly product the product, which operates and does not operate internal error correction circuit and improves the productivity.
(9) The flash memory, which can perform error correction with error correction circuit equipped in flash memory in any cases, is stable and has high reliability, in the system, to which the flash memory, which automatically reads the predetermined data from the memory cell array when the power supply is turned on, is applied.
(10) Multi-level flash memory, in which 2-bits data is written in one memory cell, with comparatively small chip size by equipping the error correction circuit using the BCH code.
(11) The flash memory, in which error correction circuit operates normally at read operation after erase operation.
(12) The flash memory, which can check whether check data is correctly generated by outputting information data read from the memory sector and check data to the external device, and has high reliability.

The first flash memory according to the present invention is characterized by comprising: a memory sector with a plurality of flash memory cells; a command interface, which receives a write data input instruction from an external device to generate a write data input instruction signal, and receives a write instruction from the external device to generate a write instruction signal; a first signal buffer, which receives a write enable signal input from the external device; a control signal generation circuit, which is activated by the write instruction signal to generate a control signal; a data input buffer, which is activated by the write data input instruction signal to receive a write data input from the external device in synchronization with the write enable signal; an error correction circuit, which is activated by the write data input instruction signal to receive the write data in synchronization with the write enable signal, and is activated by the write instruction signal to generate a check data for an error correction in synchronization with the control signal; an address buffer, which receives an address data input from the external device; an address signal generation circuit, which is activated by the write data input instruction signal to generate an address signal in a predetermined order based on the address data in synchronization with the write enable signal, and is activated by the write instruction signal to generate an address signal in a predetermined order in synchronization with the control signal; a plurality of data memory circuits, each of which is provided corresponding to each of the plurality of flash memory cells, and receives an allocated address signal, takes and temporarily memorizes the write data and the check data; and write means to be activated by the write instruction signal, and to write the write data and the check data, which are temporarily memorized in the plurality of data memory circuits in the memory sector.

As a preferable manner of the first flash memory a busy signal output circuit, which outputs a busy signal to the external device according to the write instruction signal.

According to the first flash memory, though the input of the information data to the write circuit is performed in synchronization with signal nWE controlled by the external device, the error correction circuit is operated in synchronization with two control signals. That is, the input of the write data and the output of the check data are synchronized with two signals of external control signal nWE and internal control signal CGCLK, respectively.

As a result, processing to generate the check data for the error correction with the internal error correction circuit and processing to input the check data to the write circuit, etc. can be automatically performed in the flash memory even in the period when the external control signal is not input. Therefore, it is possible to provide the compatible flash memory with the flash memory, to which the conventional error correction circuit is not equipped.

The second flash memory according to the present invention is characterized by comprising: a plurality of memory sectors, each of which has a plurality of flash memory cells; a memory cell array having the plurality of memory sectors; a control signal generation circuit, which generates a control signal; a first signal buffer, which receives a read enable signal input from an external device; an address buffer, which receives an address data input from the external device; an address signal generation circuit, which generates an address signal in a predetermined order in synchronization with the control signal, and generates an address signal in a predetermined order based on the address data in synchronization with the read enable signal; read means to select the memory sectors in the memory cell array based on the address data, and to read data from each of the plurality of flash memory cells of selected memory sectors; a plurality of data memory circuits, each of which is provided for each of the plurality of flash memory cells, temporarily memorizes data read from the plurality of flash memory cells corresponding to selected memory sectors and receives an allocated address signal and outputs the data, which is temporarily memorized, read from the plurality of flash memory cells; a data output buffer, which outputs the data, which is read from the plurality of flash memory cells and output from the plurality of data memory circuits, to the external device in synchronization with the read enable signal; and an error correction circuit, which receives the data, which is read from the plurality of flash memory cells and output from the plurality of data memory circuits, in synchronization with the control signal, judges whether the data output from the data output buffer has an error in synchronization with the read enable signal, and corrects an error if there is the error.

In addition, the preferred manners of the second flash memory may be as following (1) to (4).
(1) A command interface, which receives the status read instruction from the external device to generate a status read instruction signal; and status output means to be activated by the status read instruction signal to output whether there is an error in the data read from the plurality of flash memory cells through the data output buffer are further provided.
(2) The error correction circuit can correct a plurality of data in data read from the plurality of flash memory cells, and the status output means can output the number of errors.
(3) The error correction circuit can correct n data ($n \geq 1$) in the data read from the plurality of flash memory cells and can detect an existence of (n+1) errors, and the status output means can output whether the error can be corrected.
(4) A busy signal output circuit, which continuously outputs a busy signal to the external device for a period when data is read from the plurality of flash memory cells and the error correction circuit receives data read from the plurality of flash memory cells are further provided.

According to the second flash memory, though the information data from the read circuit is output in synchronization with signal nRE controlled from the external device, the error correction circuit operates in synchronization with two control signals. Specifically, the error correction circuit is synchronized with two signals of external control signal nRE and internal control signal ECCLK.

As a result, processing to generate the check data for the error correction with the internal error correction circuit and processing to read the read data (information data and check data) from the read circuit to the error correction circuit, etc. for the error correction can be automatically performed in the flash memory even in the period when the external control signal is not input. Therefore, it is possible to provide the compatible flash memory with the flash memory, to which the conventional error correction circuit is not equipped.

The third flash memory according to the present invention is characterized by comprising: a plurality of memory sectors, each of which has a plurality of flash memory cells; a memory cell array having the plurality of memory sectors; a command interface, which receives a correction read instruction from an external device to generate a correction read instruction signal; a control signal generation circuit, which is activated by the correction read instruction signal to generate a control signal; a first signal buffer, which receives a read enable signal input from an external device; an address buffer, which receives an address data input from the external device; an address signal generation circuit, which generates an address signal in a predetermined order based on the address data in synchronization with the read enable signal, and is activated by the correction read instruction signal to generate an address signal in a predetermined order in synchronization with the control signal; read means to select the memory sectors in the memory cell array based on the address data, and to read data from each of the plurality of flash memory cells of selected memory sectors; a plurality of data memory circuits, each of which is provided of each of the plurality of flash memory cells, temporarily memorizes a data read from the plurality of flash memory cells corresponding to the selected memory sector, respectively, receives an allocated address signal and outputs the data read from the plurality of flash memory cells, which is temporarily memorized; a data output buffer, which outputs the data, which is read from the plurality of flash memory cells and output from the plurality of data memory circuits, to the external device in synchronization with the read enable signal; and an error correction circuit, which receives the data, which is read from the plurality of flash memory cells and output from the plurality of data memory circuits, in synchronization with the read enable signal, receives the data, which is read from the plurality of flash memory cells and output from the plurality of data memory circuits, in synchronization with the control signal, judges whether there is an error in the data read from the plurality of flash memory cells, and specifies the data when there is an error.

In addition, the preferred manners of the third flash memory may be as following (1) to (4).

(1) The command interface receives a status read instruction signal to generate a status read instruction "70"H from the external device; and status output means to output whether there is an error in the data which is activated by the status read instruction signal and read from the plurality of flash memory cells, through the data output buffer.

(2) The error correction circuit can correct a plurality of data in data read from the plurality of flash memory cells, and the status output means can output the number of errors.

(3) The error correction circuit can correct n data (n≧1) in the data read from the plurality of flash memory cells and can detect an existence of (n+1) errors, and the status output means can output whether the error can be corrected.

(4) A busy signal output circuit, which outputs a busy signal to the external device for reading period of data from the plurality of flash memory cells, and outputs the busy signal to the external device and according to the correction read instruction signal is further provided.

According to the third flash memory, the error correction circuit synchronously operates with two control signals. Specifically, the error correction circuit is synchronized with two signals of external control signal nRE and internal control signal ECCLK. As a result, processing to generate the check data for the error correction with the internal error correction circuit and specify the data when the error exists, etc. can be automatically performed in the flash memory even in the period when the external control signal is not input. Therefore, it is possible to provide the compatible flash memory with the flash memory, to which the conventional error correction circuit is not equipped.

The fourth flash memory according to the present invention is characterized by comprising: a memory sector with a plurality of flash memory cells; a command interface, which receives a write data input instruction from an external device to generate a write data input instruction signal, and receives a write instruction from the external device to generate a write instruction signal; a first signal buffer, which receives a write enable signal input from the external device; a control signal generation circuit, which is activated by the write instruction signal to generate a control signal; a data input buffer, which is activated by the write data input instruction signal to receive a write data input from the external device in synchronization with the write enable signal; an error correction circuit, which is activated by the write data input instruction signal to receive the write data in synchronization with the write enable signal, and is activated by the write instruction signal to generate a check data for an error correction in synchronization with the control signal; a plurality of data memory circuits, each of which is provided for each of the plurality of flash memory cells, and takes the write data and the check data in synchronization with the write enable signal and the control signal to memorize it temporarily; and means to be activated by the write instruction signal, and to write the write data and the check data, which are temporarily memorized in the plurality of data memory circuits in the memory sector.

As a preferable manner of the fourth flash memory, a busy signal output circuit, which outputs a busy signal to the external device according to the write instruction signal is further provided.

According to the fourth flash memory, though it is different that the write data or the check data are taken in synchronization with external control signal nWE and internal control signal CGCLK, but not with the allocated address signal, when the write data or the check data is taken and is temporarily memorized into data memory circuit, compared with the first flash memory, an advantage basically similar to the first flash memory can be achieved.

The fifth flash memory according to the present invention is characterized by comprising: a plurality of memory sectors, each of which has a plurality of flash memory cells; a memory cell array having the plurality of memory sectors; a control signal generation circuit, which generates a control signal; a first signal buffer, which receives a read enable signal input from an external device; an address buffer, which receives an address data input from the external device; read means to select the memory sectors in the memory cell array based on the address data, and to read data from each of the plurality of flash memory cells of selected memory sectors; a plurality of data memory circuits, each of which is provided for each of the plurality of flash memory cells, and temporarily memorizes the data read from the plurality of flash memory cells corresponding to the selected memory sector, and outputs the data read from the plurality of flash memory cells, which are temporarily memorized in synchronization with the control signal and the read enable signal; a data output buffer, which outputs the data, which is read from the plurality of flash memory cells and output from the plurality of data memory circuits to the external device in synchronization with the read enable signal; and an error correction circuit, which receives the data, which is read from the plurality of flash memory cells and output from the plurality of data memory circuits, in synchronization with the control signal, judges whether the data output from the data output buffer has an error in synchronization with the read enable signal, and corrects the error if there is an error.

In addition, the preferred manners of the fifth flash memory may be as following (1) to (4).

(1) A command interface, which receives the status read instruction from the external device to generate a status read instruction signal; and status output means to be activated by the status read instruction signal to output whether there is an error in the data read from the plurality of flash memory cells through the data output buffer are further provided.

(2) The error correction circuit can correct a plurality of data in data read from the plurality of flash memory cells, and the status output means can output the number of errors.

(3) The error correction circuit can correct n data (n≧1) in the data read from the plurality of flash memory cells and can detect an existence of (n+1) errors, and the status output means can output whether the error can be corrected.

(4) A busy signal output circuit, which continuously outputs a busy signal to the external device for a period when data is read from the plurality of flash memory cells and the error correction circuit receives data read from the plurality of flash memory cells is further provided According to the fifth flash memory, though it is different that the data is synchronized with internal control signal ECCLK and external control signal nRE, but not with the allocated address signal, when the data is output from data memory circuit, compared with the second flash memory, an advantage basically similar to the second flash memory can be achieved.

The sixth flash memory according to the present invention is characterized by comprising: a plurality of memory sectors, each of which has a plurality of flash memory cells; a memory cell array having the plurality of memory sectors; a command interface, which receives a correction read instruction from an external device to generate a correction read instruction signal; a control signal generation circuit, which is activated by the correction read instruction signal to generate a control signal; a first signal buffer, which receives a read enable signal input from an external device; an address buffer, which receives an address data input from the external device; read means to select the memory sectors in the memory cell array based on the address data, and to read data from each of the plurality of flash memory cells of selected memory sectors; a plurality of data memory circuits, each of which is provided for each of the plurality of flash memory cells, and temporarily memorizes the data read from the plurality of flash memory cells corresponding to the selected memory sector and outputs the data read from the plurality of flash memory cells which has been temporarily memorized in synchronization with the read enable signal and the control signal; a data output buffer, which outputs the data, which is read from the plurality of flash memory cells and output from the plurality of data memory circuits, to the external device in synchronization with the read enable signal; and an error correction circuit, which receives the data, which is read from the plurality of flash memory cells and output from the plurality of data memory circuits, in synchronization with the read enable signal, receives the data, which is read from the plurality of flash memory cells and output from the plurality of data memory circuits, in synchronization with the control signal, judges whether there is an error in the data read from the plurality of flash memory cells, and specifies the data when there is an error.

In addition, the preferred manners of the sixth flash memory may be as following (1) to (4).

(1) The command interface receives a status read instruction signal to generate a status read instruction "70"H from the external device; and status output means to output whether there is an error in the data which is activated by the status read instruction signal and read from the plurality of flash memory cells, through the data output buffer.

(2) The error correction circuit can correct a plurality of data in data read from the plurality of flash memory cells, and the status output means can output the number of errors.

(3) The error correction circuit can correct n data (n≧1) in the data read from the plurality of flash memory cells and can detect an existence of (n+1) errors, and the status output means can output whether the error can be corrected.

(4) A busy signal output circuit, which outputs a busy signal to the external device for reading period of data from the plurality of flash memory cells, and outputs the busy signal to the external device and according to the correction read instruction signal is further provided.

According to the sixth flash memory, though it is different that the data is synchronized with external control signal nRE and internal control signal ECCLK, but not with the allocated address signal, when the data is output from data memory circuit, compared with the third flash memory, an advantage basically similar to the third flash memory can be achieved.

The seventh flash memory according to the present invention is characterized by comprising: a memory sector with a plurality of flash memory cells; a signal buffer, which receives a write enable signal input from an external device, and outputs a first control signal in a first period; a control signal generation circuit, which generates a second control signal in a second period different from the first period; a data input buffer, which receives a write data input from the external device in synchronization with the write enable signal; an error correction circuit, which receives the write data in synchronization with the first control signal to generate a check data for an error correction in synchronization with the second control signal; a plurality of data memory circuits, each of which is provided for each of the plurality of flash memory cells, and takes the write data and the check data in synchronization with the first control signal and the second control signal and memorizes it temporarily; means to write the write data and the check data, which are temporarily memorized in the plurality of data memory circuits, in the memory sector.

As a preferable manner of the seventh flash memory, a busy signal output circuit, which outputs busy signal to the external device in the second the period is further provided.

According to the seventh flash memory, though it is different that two internal control signals CGCLK and INCLK are used, compared with the first flash memory, an advantage basically similar to the first flash memory can be achieved.

The eighth flash memory according to the present invention is characterized by comprising: a plurality of memory sectors, each of which has a plurality of flash memory cells; a memory cell array having the plurality of memory sectors; a control signal generation circuit, which generates a first control signal in a first period; signal buffer, which receives a read enable signal input from an external device, and outputs a second control signal in a second period different from the first period; an address buffer, which receives an address data input from the external device; read means to select the memory sectors in the memory cell array based on the address data, and to read data from each of the plurality of flash memory cells of selected memory sectors; a plurality of data memory circuits, each of which is provided for each of the plurality of flash memory cells, and temporarily memorizes the data read from the plurality of flash memory cells corresponding to the selected memory sector and outputs the data read from the memory cell, which temporarily memorizes it, in synchronization with the first control signal and the second control signal; a data output buffer, which outputs the data, which is read from the plurality of flash memory cells and output from the plurality of data memory circuits, to the external device in synchronization with the second the signal; an error correction circuit, which receives the data, which is read from the plurality of flash memory cells and output from the plurality of data memory circuits, in synchronization with the first control signal, judges whether the data output from the data output buffer has an error in synchronization with the second the signal, and corrects the error if there is an error.

In addition, the preferred manners of the eighth flash memory may be as following (1) to (4).

(1) A command interface, which receives the status read instruction from the external device to generate a status read instruction signal; and status output means to be activated by the status read instruction signal to output whether there is an error in the data read from the plurality of flash memory cells through the data output buffer are further provided.

(2) The error correction circuit can correct a plurality of data in data read from the plurality of flash memory cells, and the status output means can output the number of errors.

(3) The error correction circuit can correct n data (n≧1) in the data read from the plurality of flash memory cells and can detect an existence of (n+1) errors, and the status output means can output whether the error can be corrected.

(4) A busy signal output circuit, which continuously outputs a busy signal to the external device for a period when data is read from the plurality of flash memory cells and the error correction circuit receives data read from the plurality of flash memory cells is further provided According to the eighth flash memory, though it is different that two internal control signals ECCLK and OUTCLK are used, compared with the second flash memory, an advantage basically similar to the second flash memory can be achieved.

The ninth flash memory according to the present invention is characterized by comprising: a plurality of memory sectors, each of which has a plurality of flash memory cells; a memory cell array having the plurality of memory sectors; a signal buffer, which receives a read enable signal input from an external device, and outputs a first control signal in a first period; a control signal generation circuit, which generates a second control signal in a second period different from the first period; an address buffer, which receives the address data input from the external device; read means to select the memory sectors in the memory cell array based on the address data, and to read data from each of the plurality of flash memory cells of selected memory sectors; a plurality of data memory circuits, each of which is provided for each of the plurality of flash memory cells, temporarily memorizes the data read from the plurality of flash memory cells corresponding to the selected memory sector and outputs the data read from the memory cell, which temporarily memorizes it, in synchronization with the first control signal and the second control signal; a data output buffer, which outputs the data, which is read from the plurality of flash memory cells and output from the plurality of data memory circuits, to the external device in synchronization with the first control signal; and an error correction circuit, which receives the data, which is read from the plurality of flash memory cells and output from the plurality of data memory circuits, in synchronization with the first control signal, receives the data, which is read from the plurality of flash memory cells and output from the plurality of data memory circuits, in synchronization with the second control signal, judges whether there is an error in the data read from the plurality of flash memory cells, and specifies the data when there is an error.

In addition, the preferred manners of the ninth flash memory may be as following (1) to (4).

(1) A command interface, which receives the status read instruction from the external device to generate a status read instruction signal; and status output means to be activated by the status read instruction signal to output whether there is an error in the data read from the plurality of flash memory cells through the data output buffer are further provided.

(2) The error correction circuit can correct a plurality of data in data read from the plurality of flash memory cells, and the status output means can output the number of errors.

(3) The error correction circuit can correct n data (n≧1) in the data read from the plurality of flash memory cells and can detect an existence of (n+1) errors, and the status output means can output whether the error can be corrected.

(4) A busy signal output circuit which outputs busy signal to the external device in a read period of data from the memory cell, and outputs a busy signal to the external device in the second period is further provided.

According to the ninth flash memory, though it is different that two internal control signals ECCLK and OUTCLK are used, compared with the third flash memory, an advantage basically similar to the third flash memory can be achieved.

As mentioned above, the error correction circuit is operated in synchronization with two control signals in the first to ninth flash memory according to the present invention. That is, by synchronizing the operation of the error correction circuit with the external control signal and the internal control signal, processings such as processing to generate the check data for the error correction with the internal error correction circuit, processing to input the check data to the write circuit, and processing to read the read data (information data and check data) to the error correction circuit from the read circuit for the error correction can be automatically processed internally, even in the period when the external control signal is not input. Therefore, it is possible to provide the compatible flash memory with the flash memory, to which the conventional error correction circuit is not equipped.

The tenth flash memory according to the present invention is characterized by comprising: a memory sector with a plurality of flash memory cells; a busy signal output circuit, which outputs busy signal to the external device; a data input buffer, which receives the write data written in each memory cell input from the external device; a plurality of data memory circuits which can memorize n bits to temporarily memorize the write data; and an error correction circuit, which takes m1-bits write data (m1<n) to generates m2-bits check data, and takes m3 bits write data (m1+m2+m3<n) to generate m4 bits check data (m1+m2+m3+m4≦n) after generating m2-bits check data (m1+m2<n), wherein the m2-bits check data is input to the plurality of data memory circuits after the m1-bits write data is input to the plurality of data memory circuits to be memorized temporarily, the m4 bits check data is input to the plurality of data memory circuits after the m3 bits write data is input to the plurality of data memory circuits to be memorized temporarily, and the m1 and m3 bits write data and m2 and the m4 bits check data, which are temporarily memorized in the plurality of data memory circuits, are written in the memory sector after the m4 bits check data is temporarily memorized in the plurality of data memory circuits.

According to the tenth flash memory, the information data for two memory sectors is received, and is written in two memory sectors in a lump. The busy signal is given when the information data written in the first memory sector is input, and the check data is generated internally such that the flash management system recognizes that the flash memory is in a write operation. As a result, since the check data can be generated in a short time compared with writing, the flash memory, in which an appearance write time is short, can be provided.

The eleventh flash memory according to the present invention is characterized by comprising: a memory sector with a plurality of flash memory cells; a busy signal output circuit, which outputs busy signal to the external device; an error correction circuit, which reads the read data from the memory sector and specifies the error read data, wherein a busy signal is continuously output from the busy signal output circuit to the external device from a period when the read data from the memory sector to a period when the error correction circuit specifies a error read data.

According to the eleventh flash memory, busy signal nBUSY is continuously output to the external device in the period of reading data from the memory sector and specifying the error with error correction circuit. Therefore, it is possible to provide the compatible flash memory with the flash memory, to which the conventional error correction circuit is not equipped.

The twelfth flash memory according to the present invention is characterized by comprising: a memory sector with a plurality of flash memory cells; a data buffer, which outputs a read data read from the memory sector to an external device; an error correction circuit, which output the read data from the data buffer and inputs the read data to specify an error read data from the read data, characterized in that when the read data is output from the data buffer to the external device again, the error correction circuit corrects the error read data.

In addition, the preferred manners of the twelfth flash memory may be as following (1) to (2).

(1) A status output circuit which outputs an error state to the external device is further provided.

(2) A plurality of data memory circuits, which temporarily memorize to read data read from the memory sector are further provided.

According to the twelfth flash memory, the error correction circuit is operated while outputting the read data to the external device. Thereafter, the error correction processing of the remainder data is performed, and only when there is an error, the error correction is performed again and data is output to the external device.

Therefore, it is possible to provide the flash memory, which can shorten the time required to detect the error from the read data with the internal error correction circuit and to specify the error and the appearance read time, and has the short average read time.

The thirteenth flash memory according to the present invention is characterized by comprising: a memory sector to which has a plurality of the plurality of flash memory cells; means to write an information data and a check data in the memory sector; means to read the information data and the check data from the memory sector; and an error correction circuit, which generates the check data from the information data and performs an error correction of the information data based on the information data and the check data, wherein the error correction circuit generates the check data by replacing the information data read from at least one predetermined memory cell with a predetermined dummy data, and corrects the information data by replacing the information data read from the predetermined memory cell with the dummy data.

According to the thirteenth flash memory, the information data written in the predetermined memory cell is replaced with fixed data, the check data is generated, and the error correction is performed.

Accordingly, the flash memory, which can correctly perform the error correction even when the flash memory management system writes the additional information data in the memory cell, can be provided.

The fourteenth flash memory according to the present invention is characterized by comprising: a memory sector to which has a plurality of the plurality of flash memory cells; means to write the predetermined n bits information data and a check data in the memory sector; means to read the n bits information data and the check data from the memory sector; and an error correction circuit, which generates the check data from the n bits information data and performs an error correction of the n bits information data from the n bits information data and the check data, wherein the error correction circuit effectively adds a predetermined (n−m) bits dummy data as information data when the information data input from the external device is m bits (m<n), and generates the check data.

According to the fourteenth flash memory, the error correction can be correctly performed even when the information data length input from the external device is not predetermined length. That is, the error correction can be correctly performed even when the information data length from the flash memory management system is shorter than the predetermined length. Therefore, it is possible to provide the flash memory, which can correctly perform the error correction not to depend on the information data length.

The fifteenth flash memory according to the present invention is characterized by comprising: a memory sector to which has a plurality of the plurality of flash memory cells; means to write an information data and a check data in the memory sector; means to read the information data and the check data from the memory sector; an error correction circuit, which generates the check data from the information data, and performs an error correction of the information data from the information data and the check data; and a switch circuit, which selects whether the information data is output to the external device by performing the error correction or the information data is output to the external device without the error correction.

According to the fifteenth flash memory, it is possible to select activation or deactivation of the error correction circuit equipped internally by equipping an electric switch. Therefore, it is possible to provide the flash memory, in which failure analysis can be easily performed.

That is, when the error correction circuit is always activated and corrects error and output data, though there is a disadvantage of difficulty of failure analysis in the product test, when it is unclear whether error is occurred, or which memory cell causes the error, the above-mentioned disadvantage can be prevented from being generated by providing the selection circuit.

Thus, by selecting activation or deactivation the error correction circuit equipped internally, it is possible to provide flash memory in which a failure analysis can be easily performed.

The sixteenth flash memory according to the present invention is characterized by comprising: a memory sector to which has a plurality of the plurality of flash memory cells; means to write an information data and a check data in the memory sector; means to read the information data and the check data from the memory sector; an error correction circuit, which generates the check data from the information data, and performs an error correction of the information data from the information data and the check data; and a switch circuit, which selects whether the error correction circuit is activated or deactivated.

According to the sixteenth flash memory, it is possible to select activation or deactivation of the error correction circuit equipped internally by equipping the switch which can be fixed when the product is shipped. Therefore, it is possible to provide the flash memory, in which it becomes possible to commonly produce the product, which operates the internal error correction circuit and the product, which does not operate it.

That is, when the error correction is performed in the system to which the flash memory is applied, only since the internal error correction operation slows writing and the read operations, it is necessary to deactivate the internal error correction circuit. Disadvantage of lowering productivity to divide the product which operates the internal error correction circuit and the product which does not operate it, can be solved by equipping the selection circuit.

The seventeenth flash memory according to the present invention is characterized by comprising: a plurality of memory sectors, each of which has a plurality of flash memory cells; a memory cell array having the plurality of memory sectors; means to write an information data and a check data in the memory sector; means to read the information data and the check data from the memory sector; an error correction circuit, which generates the check data from the information data, and performs an error correction of the information data from the information data and the check data; and means to read data of a predetermined memory sector according to a turn-on of a power supply.

According to the seventeenth flash memory, it is possible to provide the flash memory, in which the error correction becomes possible with the error correction circuit equipped in the flash memory in any cases, being stable and having high reliability, in the system, to which the flash memory, which automatically reads the predetermined data from the memory cell array with the power supply being turned on, is applied.

That is, in the system, which uses the flash memory, which automatically reads the predetermined data from the memory cell array with the power supply being turned on, when it is assumed to control the flash memory according to the predetermined data, it can be possible to solve the disadvantage that, when this system performs the error correction, error correction is not effective since it is previous to being turned on the system concerning the predetermined data.

The eighteenth flash memory according to the present invention is characterized by comprising: a memory sector to which has a plurality of the plurality of flash memory cells; multi-level write means to write a first information data and a first check data in each of the plurality of flash memory cells of the memory sector per one bit, thereafter, further write one bit in each of the plurality of flash memory cells of the memory sector based on the written first information data, the written first check data, a second information data and second check, to write two-bits data in one memory cell; multi-level read means to read the first information data and the first check data from the memory sector, and to read the second information data and the second check data from the memory sector; and an error correction circuit, which generates the first check data from the first information data, generates the second check data from the second information data, corrects an error in the first information data from the first information data and the first check data, and corrects an error in the second information data from the second information data and the second check data, wherein the error correction circuit performs a generation and an error correction of the check data based on a BCH code.

According to the eighteenth flash memory, the first information data and the first check data are written in each memory cell of the memory sector in one bit, thereafter, from the written first information data, the written first check data, the second information data and the second check data, further one-bit is written in each memory cell of the memory sector, and the two-bits data is written in one memory cell. The circuit based on the BCH code is equipped. Therefore, the multi-level flash memory with comparatively small chip size can be provided.

That is, error of two or more bits is caused by destroying one memory cell in the multi-level flash memory. Therefore, the method, which the burst error can be corrected, is efficient as the method of the error correction. On the other hand, the error correction circuit for the bit unit is comparatively easy, and is a little the increase of the size of the chip. The disadvantage that the relief efficiency is low when the error correction circuit, which corrects the error by the bit unit, is applied as an error correction circuit applied to a multi-level flash memory, can be solved.

The nineteenth flash memory according to the present invention is characterized by comprising: a memory sector to which has a plurality of the plurality of flash memory cells; an erase circuit which erases the memory sector, and sets data of all memory cells to "1"; means to write an information data and a check data in the memory sector; means to read the information data and the check data from the memory sector; and an error correction circuit, which generates the check data from the information data, and performs an error correction of the information data from the information data and the check data, wherein the error correction circuit generates the check data of all "1" from the information data of all "1".

According to the nineteenth flash memory, the data of the memory cell, which is erased, is set to be "0". The error correction circuit is set so that all the entire check data of "0" is generated for the information data of "0". Therefore, it is possible to provide the flash memory, in which the error correction circuit operates normally in read operation after erasure.

That is, there is a case that data is often read after the data of the flash memory, which equips the error correction circuit, is erases. The disadvantage of misdetection, of which the error exists, when the error correction circuit operates in this case, can be solved.

The twentieth flash memory according to the present invention is characterized by comprising: a memory sector with a plurality of flash memory cells; an error correction circuit, which generates a check data for the error correction from an information data input from an external device, and performs an error correction of the information data from the information data and the check data; a plurality of data memory circuits each of which is provided to each of the plurality of flash memory cells; means to write the information data and the check data, which are temporarily memorized in the plurality of data memory circuits, in the memory sector; means to read the information data and the check data from the memory sector to the plurality of data memory circuits; and means to output the information data and the check data, which is memorized in the plurality of data memory circuits, read from a memory sector to the external device.

According to the twentieth flash memory, means to output the information data and the check data read from the memory sector to the external device is comprised. Therefore, it is possible to provide the flash memory, which can checks whether the check data can be correctly generated, and has high reliability.

The twenty-first flash memory according to the present invention is characterized by comprising: a memory sector with a plurality of flash memory cells; an error correction circuit, which generates a check data for the error correction from an information data input from an external device, and performs an error correction of the information data from the information data and the check data; a plurality of data memory circuits each of which is provided to each of the plurality of flash memory cells; means to write the information data and the check data, which are temporarily memorized in the plurality of data memory circuits, in the memory sector; and means to read the information data and the check data from the memory sector to the plurality of data memory circuits, wherein the data memorized in the plurality of data memory circuits is reset to data predetermined "1" before inputting the information data from the external device.

According to the twenty-first flash memory, the information data written in the predetermined memory cell is replaced with fixed data and the check data is generated, in error correction circuit. In this case, the information data and the check data are temporarily memorized in a plurality of data memory circuits, which are provided to each memory cell, and are written in the memory cell in a lump. In the data memory circuit, the memorized data is reset to fixed data before inputting the information data. Therefore, the flash memory, which has a simple and fast circuit and can correctly perform the error correction without depending on the data length, can be provided.

The present invention is not limited to the following embodiment. The flash memory cell is not limited to the NAND type memory cell, and may include the memory cell such as the NOR type memory cells and virtual ground memory cell. The sizes of the cluster is four sectors in the embodiment as mentioned above, but it is possible to choose according to the characteristic of the system like 8 sectors, 9 sectors, and 16 sectors, etc. The number of the clusters may be the same as the number of the sectors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5A and FIG. 5B are circuit diagrams, which show the shift register and the logical operation circuit in the error correction circuit of FIG. 1;

DETAILED DESCRIPTION OF THE INVENTION

Figure 1:
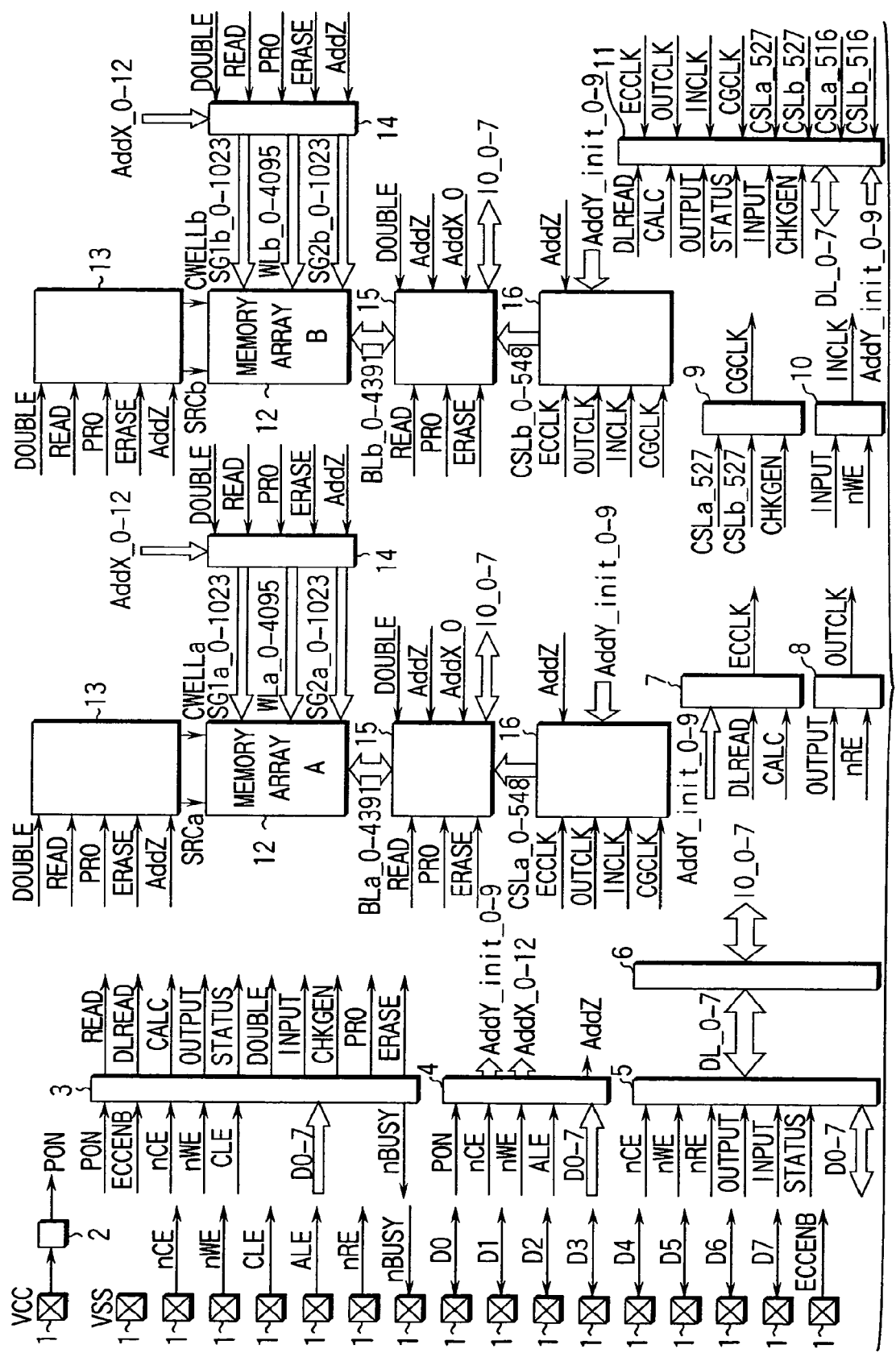
FIG. 1 is a block diagram, which shows the configuration of the flash memory according to the first embodiment of the present invention.

Hereinafter, the embodiments of the present invention will be explained in detail referring to the drawings.

First Embodiment

FIG. 1 is a block diagram, which shows the configuration of the flash memory according to the first embodiment of the present invention.

A plurality of terminals 1 are provided to receive the power supply and the signal from the external device or to output the signal to the external device. Among these terminals 1, the VCC terminal receives power-supply voltage VCC, the VSS terminal is grounded, the nCE terminal receives chip enable signal nCE, the nWE terminal receives write enable signal nWE, the CLE terminal receives command latch enable signal CLE, the ALE terminal receives address latch enable signal ALE, the nRE terminal receives read enable signal nRE, and the ECCENB terminal receives error correction circuit activation signal ECCENB.

The terminal nBUSY outputs busy signal nBUSY, and D0 terminal to D7 terminal receive input data D0 to D7 such as the write data, the command data, and the address data and output output data D0 to D7 such as the read data and the status data.

Write enable signal nWE, command latch enable signal CLE, address latch enable signal ALE, read enable signal nRE, and input data D0 to D7 are accepted when chip enable signal nCE is "L", and output data D0 to D7 are output when chip enable signal nCE is "L".

Since the display becomes complex, the power supply line supplied to each internal circuit from the VCC terminal and the ground line supplied to each internal circuit from the VSS terminal, drawings will be omitted.

Power on detection circuit 2 detects whether power-supply voltage VCC is a high voltage level enough, and when the level is enough, makes power on detection signal PON "H".

Command interface 3 receives data D0 to D7 input according to the timing that write enable signal nWE changes from "L" to "H", as command data, and outputs read instruction signal READ, data latch read instruction signal DLREAD, calculation instruction signal CALC, data output instruction signal OUTPUT, status read instruction signal STATUS, double-speed write instruction Signal DOUBLE, data input instruction signal INPUT, check data generation instruction signal CHKGEN, write instruction signal PRO, and erasure instruction signal ERASE, etc., at chip enable signal nCE="L" and command latch enable signal CLE="H". To inform read or writing etc., and to be processed internally to the external device, the busy signal nBUSY is output from the terminal nBUSY.

Address buffer 4 receives data D0 to D7 input according to the timing that write enable signal nWE changes from "L" to "H", as address data, and outputs row address data AddX_0-12, AddZ, and column address initial data AddY_init_0-9, at chip enable signal nCE="L" and address latch enable signal ALE="H"

Data I/O buffer 5 receives data input instruction signal INPUT, and data D0 to D7 input according to the timing that write enable signal nWE changes from "L" to "H" is received as write data, when chip enable signal nCE="L", address latch enable signal ALE="L", and command latch enabling CLE="L".

Data I/O buffer 5 receives data output instruction signal OUTPUT, and starts outputting read data D0 to D7 at the timing that read enable signal nRE changes from "H" to "L", when chip enable signal nCE="L". In addition, Data I/O buffer 5 receives status read instruction signal STATUS, and starts outputting status data D0 to D7 at the timing that signal nRE changes from "H" to "L", when signal nCE="L".

The write data input from D0 terminal to D7 terminal are reversed with data I/O buffer 5, further reversed again with IO buffer 6 through signal line DL_0-7, and input to column control circuit 15 through signal line IO_0-7.

The read data is reversed with IO buffer 6 through signal line IO_0-7, output to signal line DL_0-7, and is reversed again with data I/O buffer 5 and output from D0 terminal to D7 terminal. The signal line DL_0-7 is connected with error correction circuit 11.

Error correction control signal generation circuit 7 is controlled by column address initial data AddY_init_0-9, data latch read instruction signal DLREAD, and calculation instruction signal CALC, etc., and has the function to generate error correction control signal ECCLK.

Output control signal generation circuit 8 is controlled by read enable signal nRE, and data output instruction signal OUTPUT, etc., and has the function to output output control signal OUTCLK in synchronization with this read enable signal nRE.

Check data generation control signal generation circuit 9 is controlled by column address signals CSLa_527, CSL_b527, and check data generation instruction signal CHKGEN, etc., and has the function to generate check data generation control signal CGCLK.

Input control signal generation circuit 10 is controlled by data input instruction signal INPUT and write enable signal nWE, etc., and has the function to generate input control signal INCLK in synchronization with this signal nWE.

Error correction circuit 11 has the function to receive data input instruction signal INPUT, to take the write data from signal line DL_0-7 in synchronization with input control signal INCLK, and to receive check data generation instruction signal CHKGEN and to output the check data and the parity data to signal line DL_0-7 in synchronization with check data generation control signal CGCLK.

Error correction circuit 11 has the function to receive data latch read instruction signal DLREAD, to take the read data from signal line DL_0-7 in synchronization with error correction control signal ECCLK, in addition, to receive calculation instruction signal CALC, and to detect the error in the read data in synchronization with error correction control signal ECCLK.

Error correction circuit 11 has the function to receive data output instruction signal OUTPUT and to correct the data, which has the error, in synchronization with output control signal OUTCLK, and has the function to receive status read instruction signal STATUS and to output the status of the error correction circuit to signal line DL_0-7.

This error correction circuit 11 is also controlled by column address signal CSLa_527, CSLb_527, CSLa_516, CSLb_516, and column address initial data AddY_init_0-9, etc.

Memory cell array 12 is provided and source-well control circuit 13, row control circuit 14, column control circuit 15, and column address generation circuit 16 are provided corresponding to memory cell array 12.

Source-well control circuit 13 controls source line SRC of memory cell array 12 and well CWELL in which memory cell array 12 is formed.

Row control circuit 14 controls word line WL and select gate line SG in memory cell array 12. Column control circuit 15 controls bitline BL of memory cell array 12. Column address generation circuit 16 is controlled by address signals AddZ, AddY_init_0-9, error correction control signal ECCLK, output control signal OUTCLK, check data generation control signal CGCLK, and input control signal INCLK, etc., and generates column address signal CSL in a predetermined order in synchronization with these control signals.

In this embodiment, two pieces are provided to the memory cell array 12, each the circuit 13, 14, 15, and 16, and one of these two pairs is selected by address signal AddZ. For example, memory cell array A and circuits 13 14, 15 and 16 corresponding thereto are selected when address signal AddZ="L", and memory cell array B and circuits 13 14, 15 and 16 corresponding thereto are selected when address signal AddZ="H".

Figure 2:
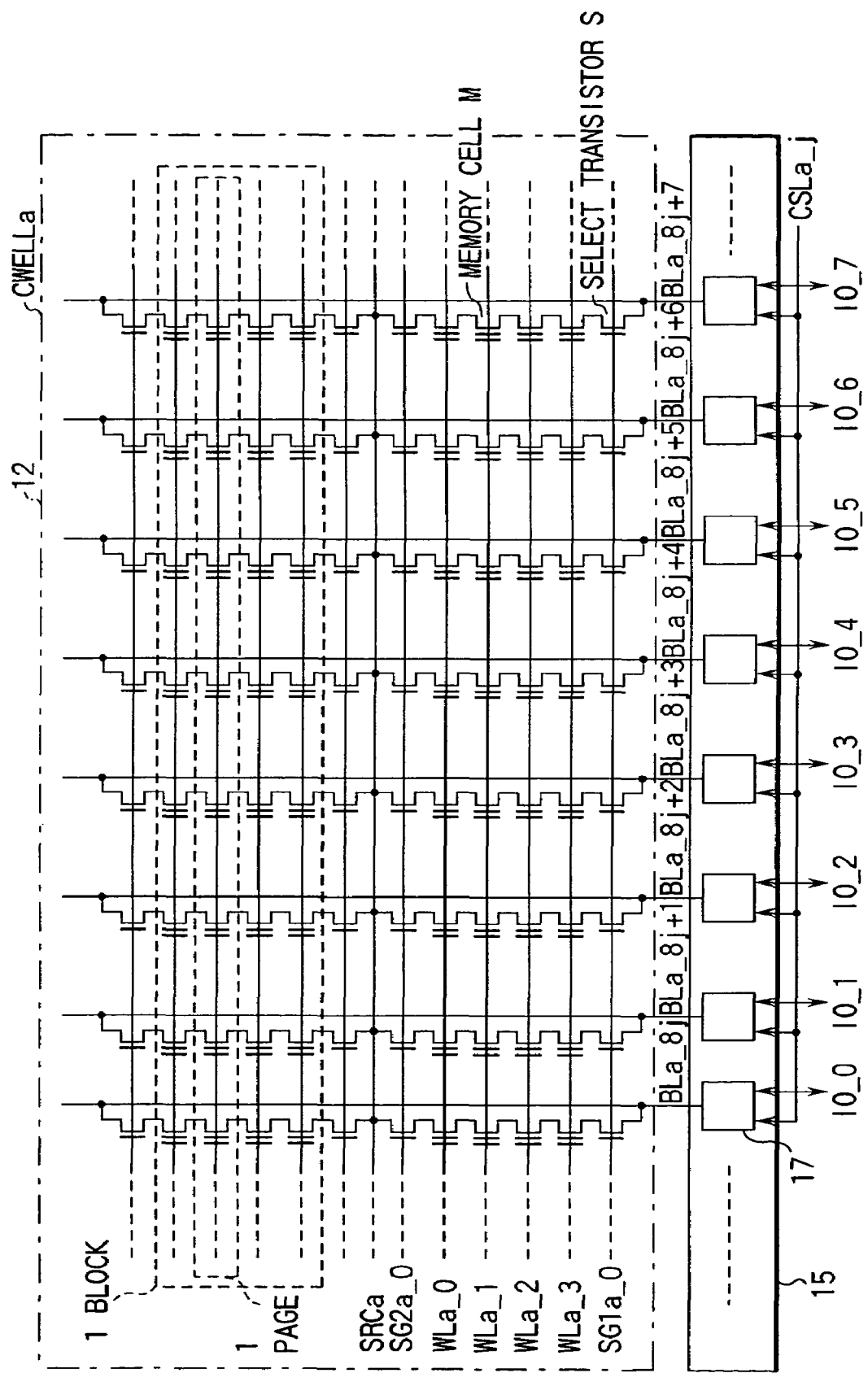
FIG. 2 is a circuit diagram, which takes out and shows one memory cell array in FIG. 1.

FIG. 2 shows a detailed configuration by taking out one memory cell array 12 (memory cell array A) and one column control circuit 15 corresponding thereto.

This memory cell array 12 uses the array of the NAND type memory cell unit formed in the same well CWELLa. In the NAND type memory cell unit, for example, four cell transistors M, each having a shape that the floating gate and the control gate are accumulated, are connected in series, and select transistors S are connected with the both ends thereof. One end of this NAND cell unit is connected with either one of bitline BLa_8j to BLa_8j+7, and another end is connected with common source line SRCa.

Here, the set of cell transistor M of the same line is called one page, and a consecutive set of four pages is called one block. The word line corresponding to four cell transistors M in certain one block is shown by WLa_0 to WLa_3, the select gate line of select transistor S on the part side of the NAND cell unit is shown by SG1a_0, and the select gate line of select transistor S on the edge side besides the NAND cell unit is shown by SG2a_0.

Column control circuit 15 includes data memory circuit 17 connected with bitline BLa_8j to BLa_8j+7 of memory cell array 12. This data memory circuit 17 is electrically connected with signal line IO_0-7 when it is selected by column address signal CSLa_j, temporarily memorizes the data to write in selected memory cell M, and temporarily memorizes the read data read from selected memory cell M.

Subscript j of bitline BLa_8j to BLa_8j+7 and column select line CSLa_j is from 0 to 548 in memory cell array 12 of FIG. 2. Therefore, bitlines BLa are from BLa_0 to BLa_4391, and column signals CSLa are from CSLa_0 to CSLa_548. Memory cell array B is a similar configuration thereto.

Next, operation of memory cell array 12 of FIG. 2 will be explained briefly.

(a) Data erasure is performed by block unit, all word lines (for example, WLa_0 to WLa_3) in the selected block is set to 0V and all word lines in unselected block are set to 20V. At this time, well CWELLa is set to 20V, the threshold voltage of the memory cell becomes 0V or less, and data is reset to "11".

(b) Write data is performed by page unit. Here, when one memory cell M is assumed to memorize four levels, memory cell M, in which row address data AddX_0 is "L", is selected, the write data "0" or "1" is memorized, and the data of the memory cell becomes "10" or "11". If row address data AddX_1 to AddX_12 are the same value, the same memory cell M is selected, and when "0" is written in the memory cell to which "10" is originally memorized, it becomes "00", when "1" is written in the memory cell to which "10" is originally memorized, it becomes "10", when "0" is written in the memory cell to which "11" is originally memorized, it becomes "01", and when "1" is written in the memory cell to which "11" is originally memorized, it becomes "11".

The selected word line is set to 20V, and unselected word line is set to 10V at the time of writing. The bitline is set to VCC when the write data "1" is written, and the bitline is set to 0V when the write data "0" is written. The voltage of select gate line SG1 is VCC and select gate line SG2 thereof is 0V. All of the word lines and the select gate lines in unselected block are set to 0V. The control of the threshold voltage of the memory cell improves by performing writing while repeating the write operation and the write verification operation.

Table 1 shows data and the relation of the threshold voltage of memory cell M.

TABLE 1

| DATA OF MEMORY CELL | | THRESHOLD VOLTAGE OF MEMORY CELL |
|---|---|---|
| AddX_0 = "H" | AddX_0 = "L" | |
| 1 | 1 | 0 V or Less |
| 1 | 0 | 0.3 V to 0.6 V |
| 0 | 1 | 1.2 V to 1.5 V |
| 0 | 0 | 2.1 V to 2.4 V |

(c) Reading data is performed by page unit, all select gate lines are set to 4V, the selected word lines are set to 0V, 0.9V or 1.8V and unselected word lines are set to 4V. All select gates and all word lines of unselected blocks are set to 0V.

When the selected word line is set to 0V and the cell current flows, the level of the bitline voltage becomes "L" and "11" can be read. Similarly, "10" can be read setting the selected word line to 0.9V and "01" and "00" can be read by setting selected word line to 1.8V.

Table 2 shows the voltage relation of each operation of the selected block.

TABLE 2

| | ERASE | WRITE | READ |
|---|---|---|---|
| BITLINE BL | 20 V | VCC/0 V | H/L |
| SELECT GATE LINE SG1 | 20 V | VCC | 4 V |
| SELECTED WORD LINE WL | 0 V | 20 V | 0.0 V/0.9 V/1.8 V |
| UNSELECTED WORD LINE WL | — | 10 V | 4 V |
| SELECT GATE LINE SG2 | 20 V | 0 V | 4 V |
| SOURCE LINE SRC | 20 V | VCC | 0 V |
| WELL CWELL | 20 V | 0 V | 0 V |

Here, the page is a physical unit, which shows the set of 4392 memory cells M of the same line shown in FIG. 2, and the logical writing and reading unit are the memory sectors in 4392-bits. In this example, the data of two logical memory sectors are written on one physical page, or, the data of two logical memory sectors is read from one physical page. That is, an address of the memory sector is specified by row address data Addx_0 to AddX_12 and row address data AddZ. Therefore, a physical unit to be erases is a block, is constructed by four physical pages, and is constructed by eight logical memory sectors.

Figure 3:
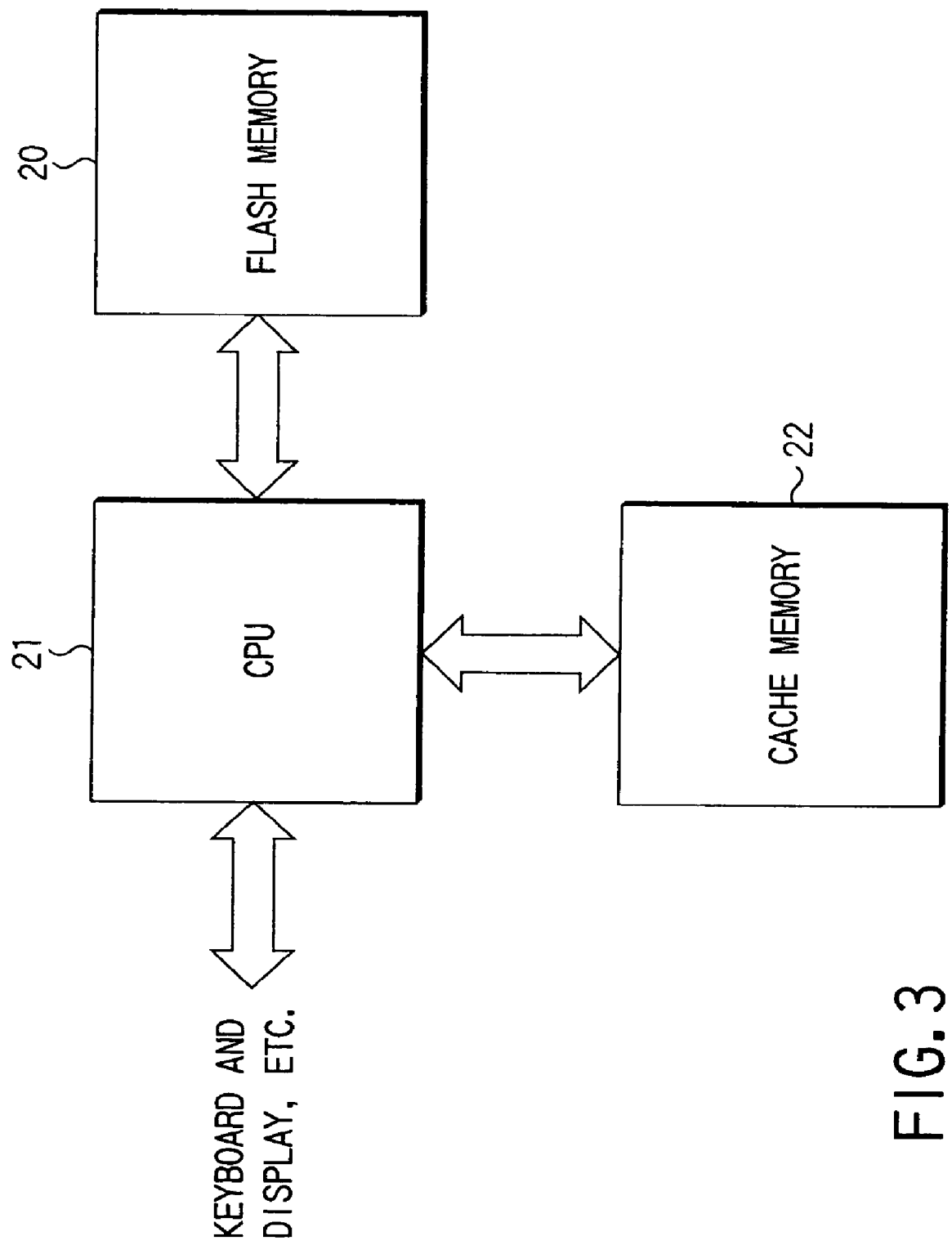
FIG. 3 is a block diagram, which shows the configuration of system to which flash memory of FIG. 1 is applied.

FIG. 3 is configuration figure of the system to which the flash memory of the configuration shown in FIG. 1 is used.

Flash memory 20 is controlled with CPU 21 (central processing unit). CPU 21 controls cache memory 22, in addition, keyboard, and the display, etc. Power-supply voltage VCC is commonly supplied to flash memory 20, CPU 21, and cache memory 22.

In this system, the program to control the entire system is stored in flash memory 20. Flash memory 20 automatically reads the data of the predetermined address at the time of raising power-supply voltage VCC by the turning on power supply of this system. CPU 21 reads data from flash memory 20 at the time of raising the power supply, and this read data has a code to control flash memory 20.

CPU 12 stores the above-mentioned code in cache memory 22, controls flash memory 20, reads the program which controls the entire system, and controls the system. Since flash memory 20 automatically performs the error correction, CPU 21 only has to read data from flash memory 20. Though CPU 21 must perform an error correction if flash memory 20 cannot be automatically performed at error correction, since the code to control flash memory 20 is stored in flash memory 20, error correction can not be performed by using only this code.

Figure 4:
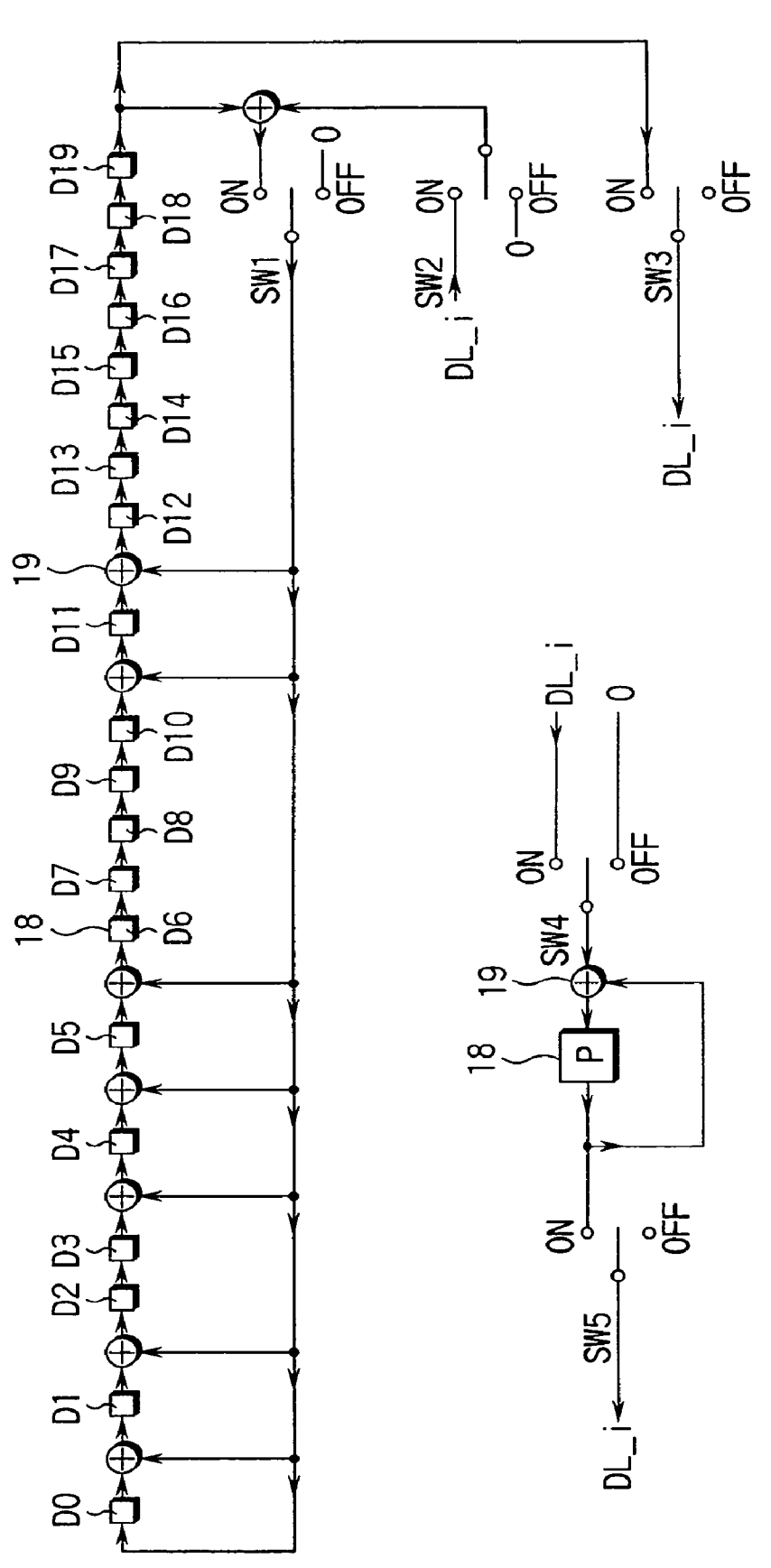
FIG. 4 is a circuit diagram, which shows check data generation section in the error correction circuit of FIG. 1.

FIG. 4 shows the part (check data generation circuit), which generates the check data from the information data (write data, which is the external input) in error correction circuit 11 of the FIG. 1. This circuit is chiefly constructed by twenty-one shift registers 18 and nine logical operation circuits 19 shown by D0 to D19 and P.

FIG. 5A shows the configuration by taking out one shift register 18 (shown by D) in FIG. 4.

This shift register is driven by complementary signals which consist of clock signal Φ and inversion signal nΦ thereof, and outputs the latch data by changing the clock signal Φ as "L"→"H"→"L" (for one cycle of clock signal Φ), and takes and latches the input signal. This clock signal Φ is a signal which synchronizes with check data generation control signal CGCLK and input control signal INCLK.

FIG. 5B shows the configuration of one logical operation circuit 19 of the FIG. 4.

This logical operation circuit performs arithmetic of two input IN1 and IN2 and outputs OUT.

The logic of the write data input from D0 terminal to D7 terminal is reversed in data I/O buffer 5 and the reversed data is output to signal lines DL_0 to DL_7. The check data generation circuit of FIG. 4 is provided to the error correction circuit of the FIG. 1 corresponding to this each signal line DL_0 to DL_7.

The clock signal Φ is turned by one cycle, the write data of one bit is taken into the check data generation circuit of FIG. 4, and the check data with twenty bits is generated in shift register 18 shown by D0 to D19 after 528 cycles of the clock signal Φ. The parity data is generated in shift register 18 shown by P.

The check data generated in shift register 18 shown by D0 to D19 are generated in each signal line DL_0 to DL_7 by one bit every time of one cycle of the clock signal Φ, switch SW3 is turned on.

When switch SW5 is turned on and the clock signal Φ is turned by one cycle after generating the check data with twenty bits, the parity data with one bit is generated in each signal line DL_0 to DL_7. Therefore, the check data with twenty bits and the parity data with one bit are generated from the data with 528 bits input to D0 terminal to D7 terminal by turning the clock signal Φ by 549 cycles. The check data and the parity data generated like this are output to signal lines DL_0 to DL_7, sent to data memory circuit 17 of the column control circuit 15 shown in FIG. 2, and written in the memory sector selected with the write data.

All the check data and the parity data generated from the write data of all "1"(write data of "0" on signal lines DL_0 to DL_7) are "1". Therefore, the erase state is equivalent to the state to write the write data of all "1", and check data and parity data generated therefrom.

Above-mentioned check data generation circuit generates the check data based on double error correction BCH(1023, 1003) code, and so-called generation polynomial G(x) thereof is: $G(x)=x^{20}+x^{12}+x^{11}+x^6+x^5+x^4+x^2+1$.

Since the data with two bits is written in one memory cell, the possibility, that the error of two bits is caused when one memory cell is destroyed, is high. However, since each bit data is independently corrected by each check data in this example, the relief probability is not lowered by the bit unit correction method like the BCH code. Oppositely, since the error correction circuit becomes complex, the burst-fault correction method like the Reed-Solomon code is undesirable in the memory device which causes the fault by one bit unit.

Figure 6:
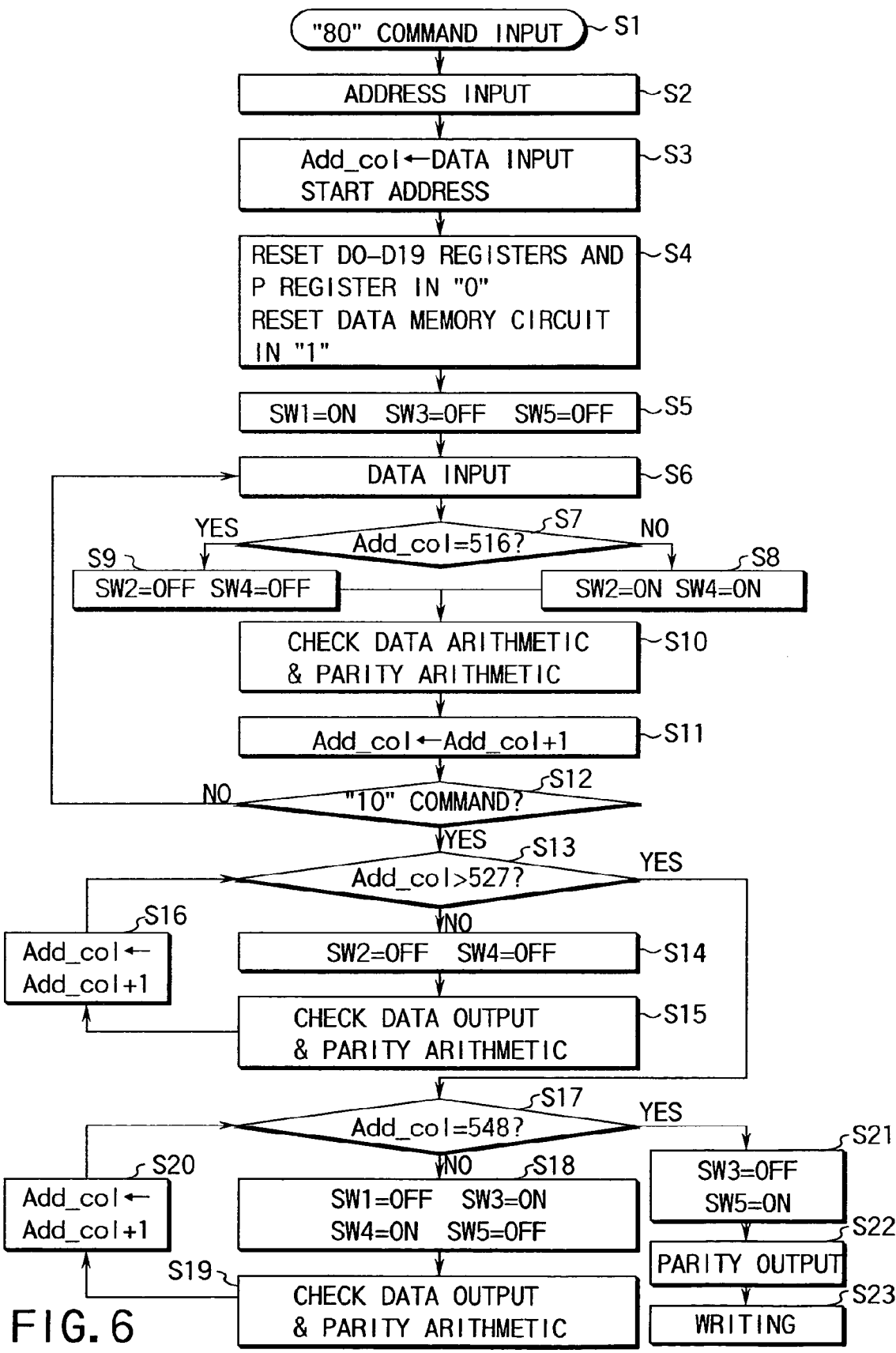
FIG. 6 is a figure, which shows an example of write algorithm in the first embodiment.

FIG. 6 shows the algorithm of the generation of the check data and the parity data in error correction circuit 11 of the FIG. 1.

First, for example, the hexadecimal code "80"H is input to command interface 3 as a data input instruction (command) (step S1). The address data is input to address buffer 4 and the input of the write data is started (step S2). Data input start column addresses AddY_init_0 to AddY_init_9 are input in variable column address register Add_col in column address generation circuit 16, and column address signal CSL is generated according to the content of this variable column address register Add_col (step S3).

The registers shown by D0 to D19 and P are reset to "0" and the write data to data memory circuit 17 is reset to "1" (step S4). Switch SW1 is turned on, and switch SW3 and SW5 are turned off (step S5).

Next, the write data input to D0 terminal to D7 terminal are taken (step S6). Switch SW2 and SW4 are turned off (step S9) if it is judged that the content of variable column address register Add_col is 516 (step S7), and switch SW2 and SW4 are turned on of if it is judged that the content of variable column address register Add_col is not 516 (step S8).

As a result, when the content of variable column address register Add_col is 516, the write data "1" will be taken into error correction circuit 11 (since the data of DL_i is inversion data). That is, the data of column address 516 will be excluded from the error correction.

There are the following advantages by this process. That is, data of 516th address can be added and necessary flag data (for example, fault sector flag etc.) on the management of the data memorized in flash memory 20 can be added.

Next, the write data is taken into error correction circuit 11 and the check data and the parity data are calculated (step S10). That is, the clock signal Φ is turned by one cycle. At this time, column address signal CSL is output and the write data is also memorized in data memory circuit 17. And, the content of variable column address register Add_col is incremented by one, and the write data is taken in order of the column address (step S11). Operations of steps S6 to S12 are repeated until input of, for example, the hexadecimal code "10"H, which is the write instruction, is judged (step S12).

Above-mentioned steps S6 to S12 are performed in synchronization with write enable signal nWE. Input control signal INCLK is generated by input control signal generation circuit 10 in synchronization with write enable signal nWE. The write data input in synchronization with write enable signal nWE is taken into error correction circuit 11 according to the clock signal Φ generated by error correction circuit 11 in synchronization with input control signal INCLK, and temporarily memorized in data memory circuit 17 selected at the same time with the instruction of column address signal CSL generated in synchronization with input control signal INCLK according to the content of variable column address register Add_col.

When the input of the hexadecimal code "10"H, which is the write instruction, is judged in step S12, whether the content of variable column address register Add_col is larger than that of 527 (step S13) is judged. As a result of this judgment, if the content of variable column address register Add_col is equal to or smaller than 527, switches SW2 and SW4 are turned off (step S14), the check data and parity are calculated, it is assumed that "1" write data is input virtually (step S15), the content of variable column address register Add_col is incremented by one (step S16), and whether the content of variable column address register Add_col is larger again than that of 527 (step S13) is judged, again.

As a result of this judgment, if the content of variable column address register Add_col is equal to or smaller than 528, it is further judged whether the content of variable column address register Add_col is 548 (step S17). As a result of this judgment, if the content of variable column address register Add_col is not equal to 548, switch SW1 and SW5 are turned off and switch SW3 and SW4 are turned on (step S18), and parity arithmetic is performed with the output of the check data (step S19). At this time, the check data is temporarily memorized in data memory circuit 17 according to the content of variable column address register Add_col. And, the content of variable column address register Add_col is incremented by one (step S20), and whether content of variable column address register Add_col is equal to 548 or not is judged again (step S17).

As a result of this judgment, when the content of variable column address register Add_col becomes 548, switch SW3 is turned off and switch SW5 is turned on (step S21), and the parity data is output (step S22). At this time, the check data is temporarily memorized in data memory circuit 17 according to the content of variable column address register Add_col. Thereafter, the write data, the check data, and the parity data memorized in data memory circuit 17 are basically written in the memory sector in a lump (step S23).

Above-mentioned steps S13 to S22 are performed in synchronization with check data generation control signal CGCLK. Check data generation instruction CHKGEN is generated by write instruction signal PRO, and check data generation control signal CGCLK is automatically generated in check data generation control signal generation circuit 9 by this check data generation instruction CHKGEN. The check data and the parity data generated from error correction circuit 11 in synchronization with this check data generation control signal CGCLK is temporarily memorized to data memory circuit 17 selected by the instruction of column address signal CSL generated according to the content of variable column address register Add_col in synchronization with check data generation control signal CGCLK at the same time.

Figure 7:
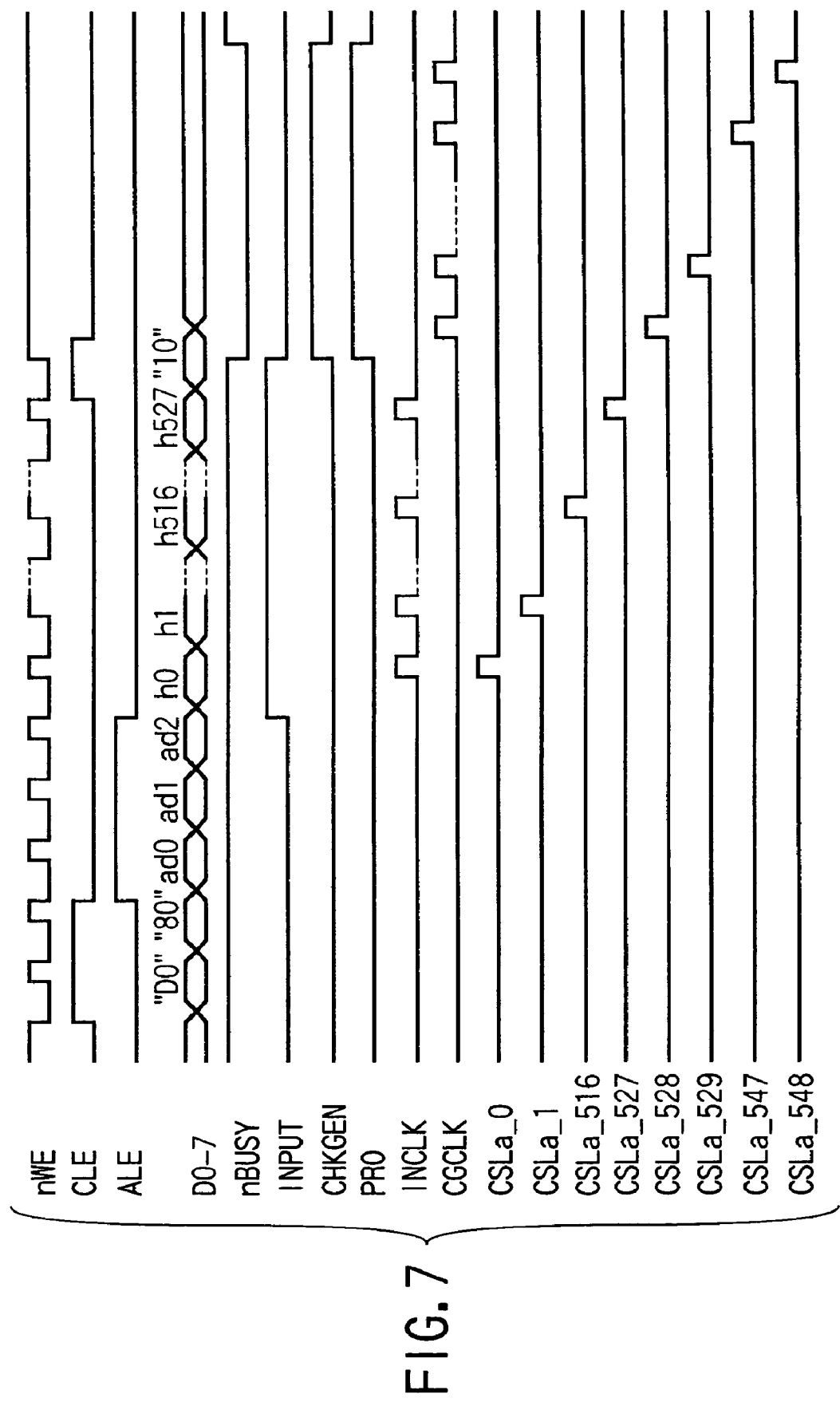
FIG. 7 is a figure, which shows an example of timing of operation to write data to two memory sectors at the same time in write algorithm of FIG. 6.

FIG. 7 shows an example of the timing of operation to select the memory sector from each array A and B in memory cell array 12 one by one and to write data in two sectors at the same time.

Figure 8:
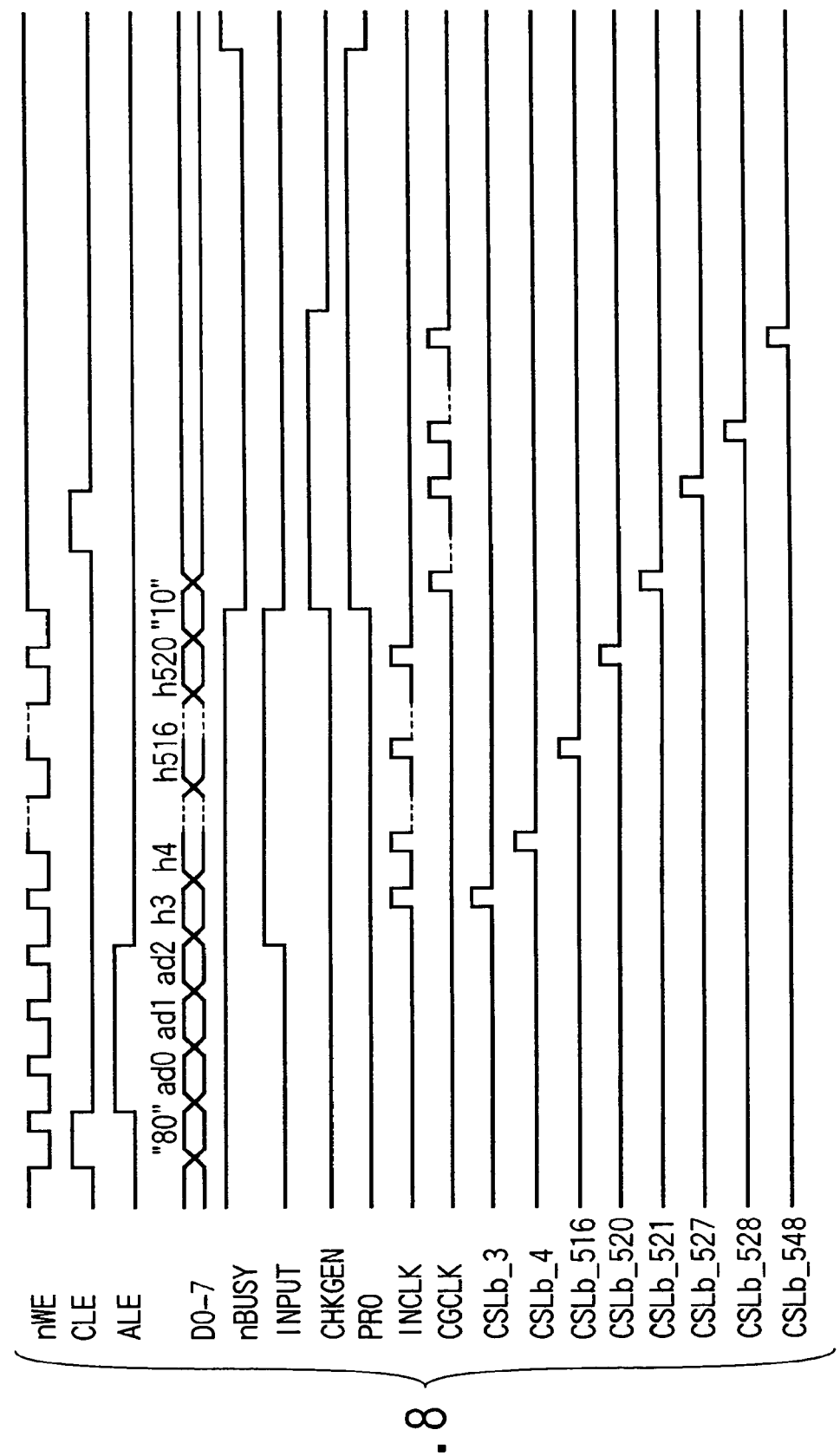
FIG. 8 is a figure, which shows an example of timing of operation to write data to only one memory sector in write algorithm of FIG. 6.

FIG. 8 shows an example of the timing of operation to select the memory sector from each array A and B in memory cell array 12 one by one and to write data in only sector.

First, operation timing of FIG. 7 will be explained. At raise of write enable signal nWE in the period when command latch enable signal CLE is "H", the hexadecimal code "D0"H is input, for example, as a double-speed write instruction. Subsequently, the hexadecimal code "80"H is input as a data input instruction at raise of write enable signal nWE in the period when command latch enable signal CLE is "H" in step S1 of FIG. 6.

The address data is taken thrice in the period when address latch enable signal ALE is "H", as described in steps S2 to S5 of FIG. 6. Here, the address in cell array A in memory cell array 12 is input. Data input instruction signal INPUT becomes "H" and write data h0 to h527 are input as described in steps S6 to S12 of FIG. 6. Write data h is input in synchronization with write enable signal nWE, is taken into error correction circuit 11 according to the clock signal Φ generated by error correction circuit 11 in synchronization with input control signal INCLK, and is temporarily memorized in data memory circuit 17 selected by the instruction of column address signal CSL generated at the same time, in synchronization with INCLK according to the content of variable column address register Add_col.

When the hexadecimal code "10"H, which is the write instruction, is input, write instruction signal PRO becomes "H", as described in steps S13 to S22 of FIG. 6, and check data generation instruction signal CHKGEN becomes "H" by this write instruction signal PRO, too. Check data generation control signal CGCLK is generated by this check data generation instruction signal CHKGEN, and the check data and the parity data generated from error correction circuit 11 in synchronization with this check data generation control signal CGCLK are temporarily memorized in data memory circuit 17 selected at the same time by the instruction of column address signal CSL generated in synchronization with CGCLK according to the content of variable column address register Add_col.

The writing operation of an effective writing (step S23 of FIG. 6) is not performed by the hexadecimal code "D0"H, which is the double-speed write instruction, when the parity data is memorized in data memory circuit 17, write instruction signal PRO and check data generation instruction signal CHKGEN become "L", and write is ended. nBUSY becomes "L" and the busy state (during internal processing) is informed to the external device in the period when write instruction signal PRO and check data generation instruction signal CHKGEN are "H".

Next, operation timing of FIG. 8 will be explained. The hexadecimal code "80"H, which is the data input instruction, is input at raise of write enable signal nWE in the period when command latch enable signal CLE is "H", as described in step S1 of FIG. 6.

Continuously, the address data is taken thrice in the period when address latch enable signal ALE is "H", as described in steps S2 to S5 of FIG. 6. Here, the address in cell array B in memory cell array 12 is input.

Subsequently, data input instruction signal INPUT becomes "H", and write data h3 to h520 is input as described in step S6 to S12 of FIG. 6. Write data h is input in synchronization with write enable signal nWE, is taken into error correction circuit 11 according to the clock signal Φ generated in synchronization with INCLK in error correction circuit 11, and is temporarily memorizes to data memory circuit 17 selected by the instruction of column address signal CSL generated in synchronization with input control signal INCLK according to the content of variable column address register Add_col at the same time.

Write data h0 to h2 are not input, but the write data of data memory circuit 17 is reset to "1", if write data h0 to h2 are "1" in the error correction circuit 11, there is no disadvantage since the contents of the register shown by D0 to D19 and the register shown by P do not change by the arithmetic to h2. That is, write data h0 to h2 are assumed to be "1" in the effect. When the hexadecimal code "10"H, which is the write instruction, is input, write instruction signal PRO becomes "H", as described in steps S13 to S22 of FIG. 6, and check data generation instruction signal CHKGEN becomes "H" by this write instruction signal PRO, too. Check data generation control signal CGCLK is generated by this check data generation instruction signal CHKGEN, and the dummy write data "1" is generated internally in synchronization with CGCLK instead of write data h521 to h527, which are not input from the external device. The check data and the parity data generated from error correction circuit 11 in synchronization with above-mentioned check data generation control signal CGCLK are temporarily memorized to data memory circuit 17 selected by the instruction of column address signal CSL generated in synchronization with CGCLK according to the content of variable column address register Add_col at the same time.

When the parity data is memorized in data memory circuit 17, check data generation instruction signal CHKGEN becomes "L", write operation is started. In this example, writing is performed to two memory sectors selected from cell arrays A and B of memory cell array 12 at the same time. nBUSY becomes "L" and the busy state (internal processing) is informed to the external device in the period when write instruction signal PRO is "H".

Figure 9:
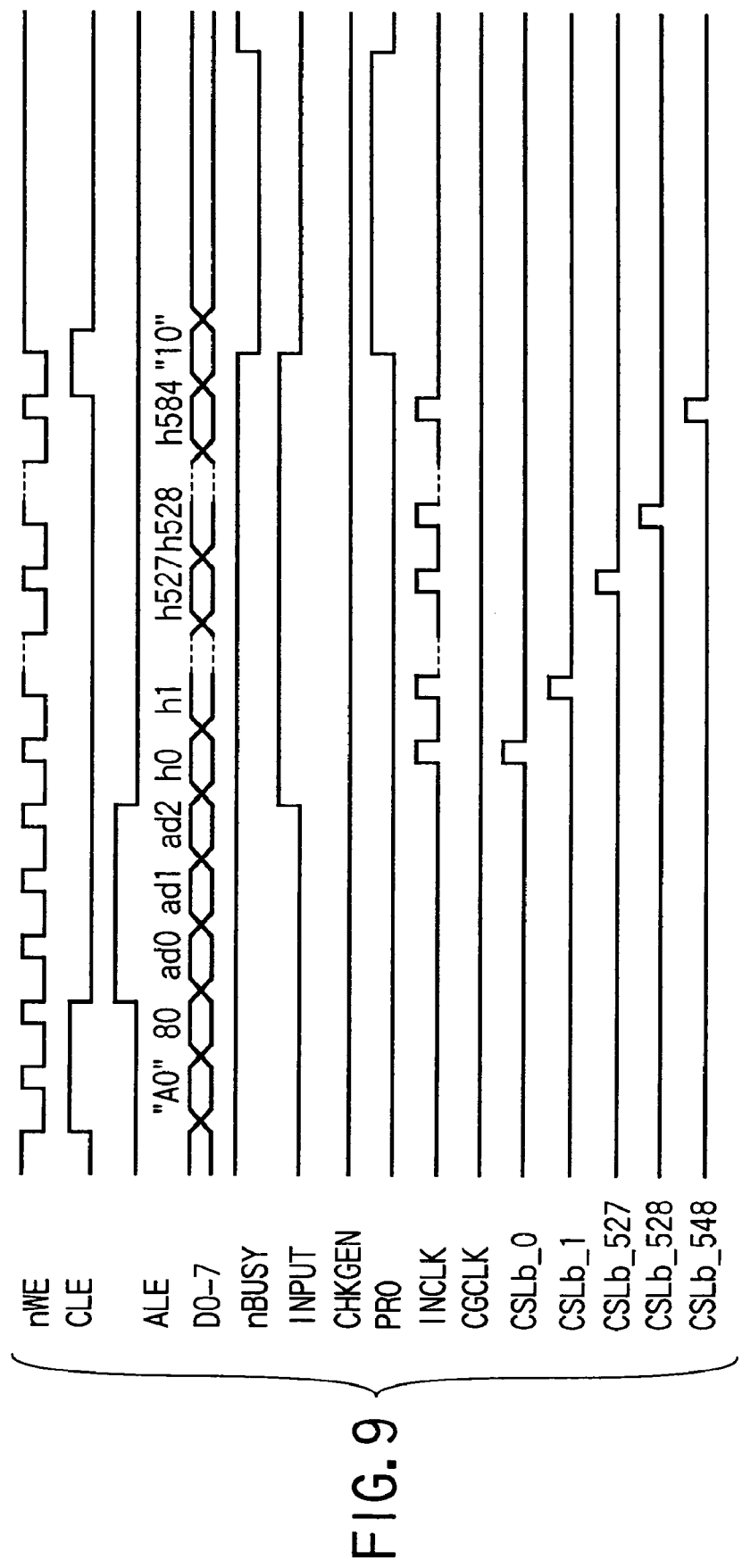
FIG. 9 is a figure, which shows write timing according to the embodiment.

FIG. 9 shows an example of the timing of the data writing operation when error correction circuit 11 is deactivated. First, the hexadecimal code "A0"H is input, for example, as an error correction deactivation instruction at of raise of write enable signal nWE in the period when command latch enable signal CLE "H". Continuously, the hexadecimal code "80"H is input as a data input instruction at raise of command latch enable signal CLE in the period when write enable signal nWE is "H".

Address latch and enable signal ALE are continuously taken and the address data is taken thrice in the period of "H". Data input instruction signal INPUT continuously becomes "H", and write data h0 to h548 are input. If the hexadecimal code "10"H, which is the write instruction, is input, though write instruction signal PRO becomes "H", check data generation instruction signal CHKGEN is "L". It immediately becomes in write operation after the hexadecimal code "10", which is the write instruction, is input.

Command interface 3 switches whether error correction circuit 11 is activated or deactivated. When error correction circuit activation signal ECCENB input to the terminal ECCENB is assumed to be "L", command interface 3 is switched to deactivate error correction circuit 11.

Figure 10:
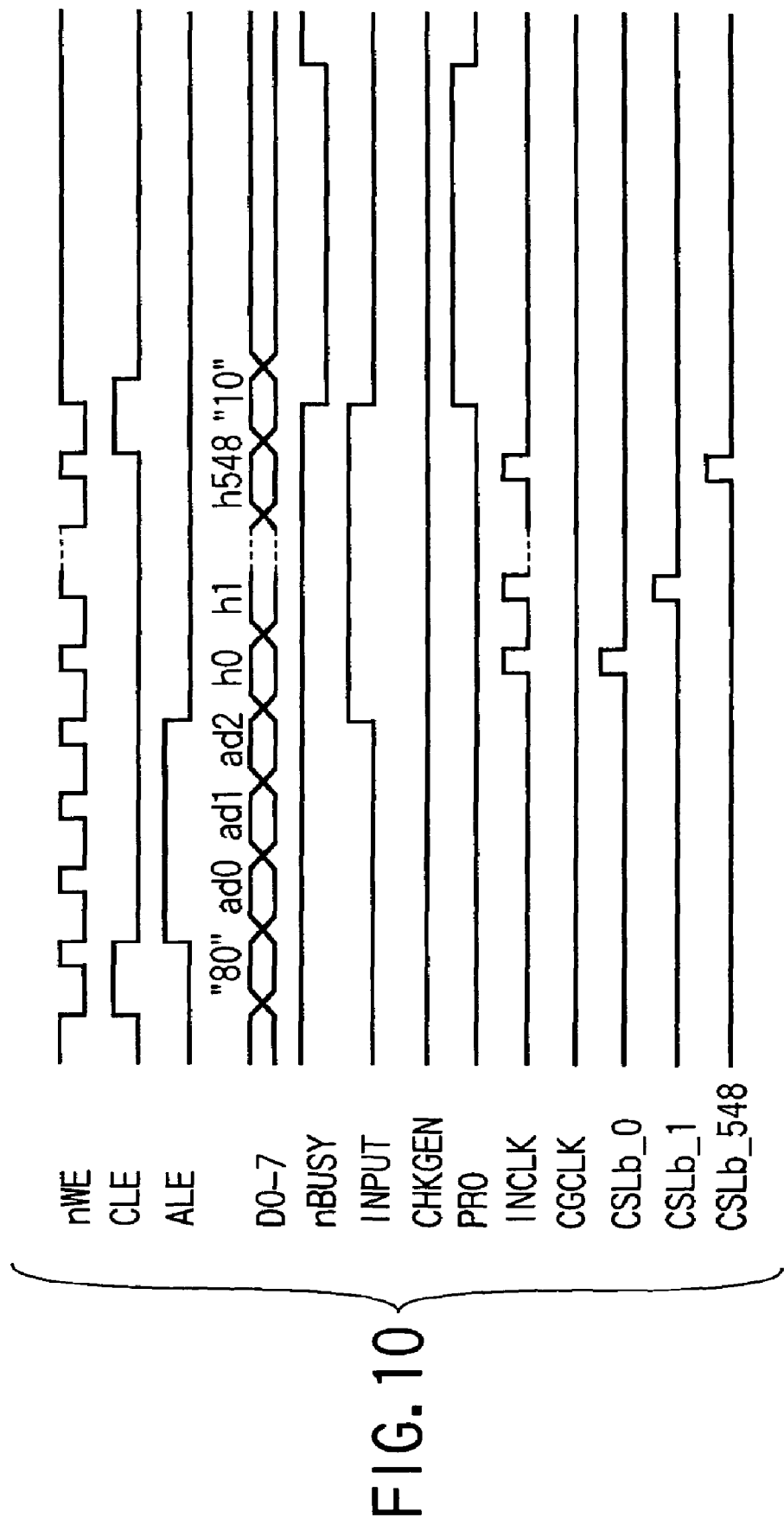
FIG. 10 is a figure, which shows write timing according to the embodiment.

FIG. 10 shows an example of the timing of the data writing operation when error correction circuit activation signal ECCENB is assumed to be "L". The hexadecimal code "A0"H as the error correction deactivation instruction, is input at raise of write enable signal nWE in the period when command latch enable signal CLE is "H". Continuously the address data is taken thrice in the period when address latch and enable signal ALE are "H". Data input instruction signal INPUT becomes "H", and write data h0 to h548 are input. If the hexadecimal code "10"H, which is the write instruction, is input, write instruction signal PRO becomes "H", but check data generation instruction signal CHKGEN is "L". It immediately becomes in write operation after the hexadecimal code "10", which is the write instruction, is input.

Error correction circuit activation signal ECCENB shows "H" at the operation timing shown in FIG. 8, and the check data is automatically generated by the flow of the data input instruction "80"→address input→data input→write instruction "10", as well as the operation timing shown in FIG. 10. When error correction circuit activation signal ECCENB shows "L", the check data is not generated like the operation timing shown in FIG. 10.

FIG. 11 to FIG. 17 show the part of correcting and detecting data in which the error is caused from the data read from the memory cell in error correction circuit 11 of the FIG. 1.

Figure 11:
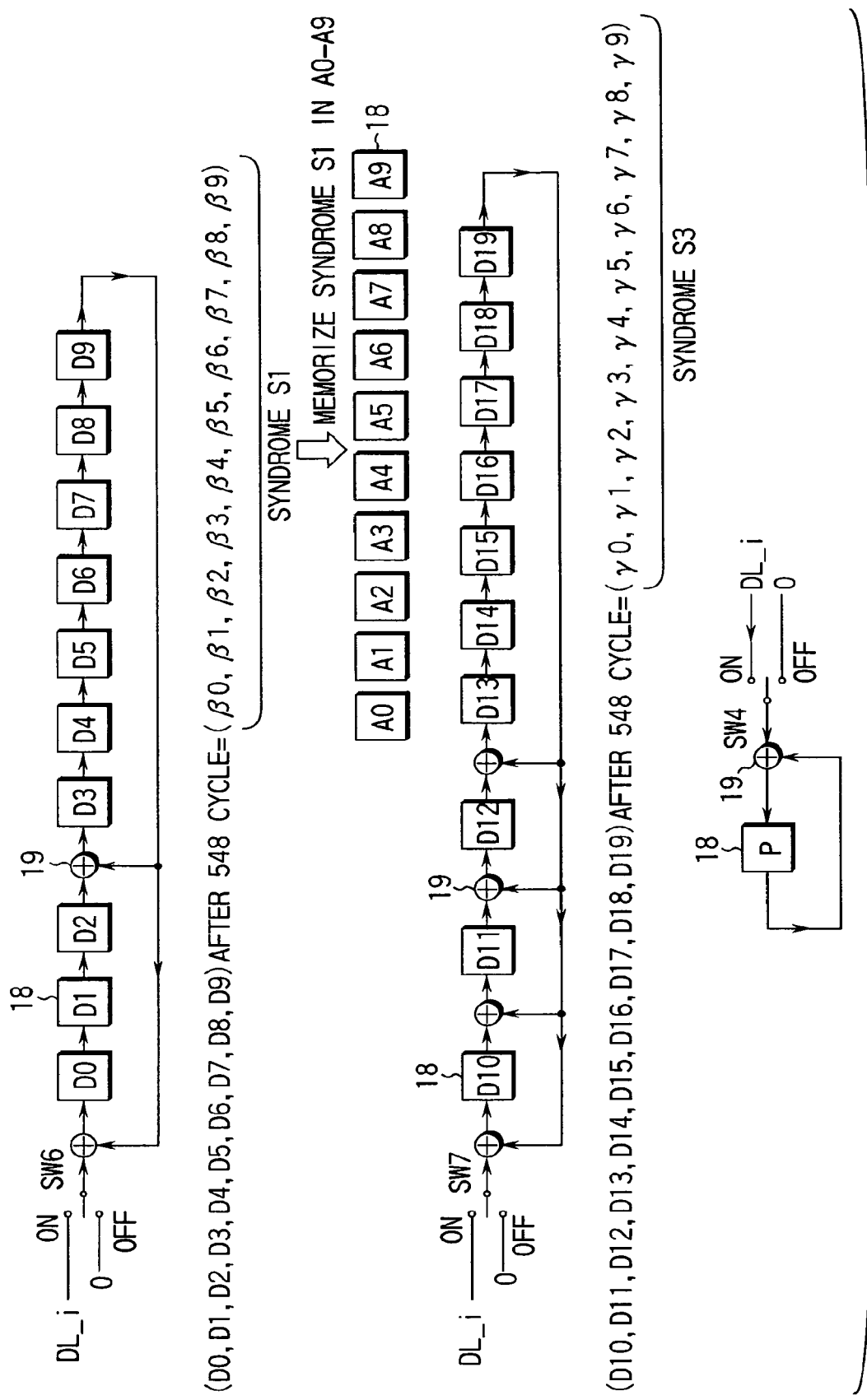
FIG. 11 is a figure, which shows generation section of syndromes S1 and S3 in the error correction circuit of FIG. 1.
Figure 12:
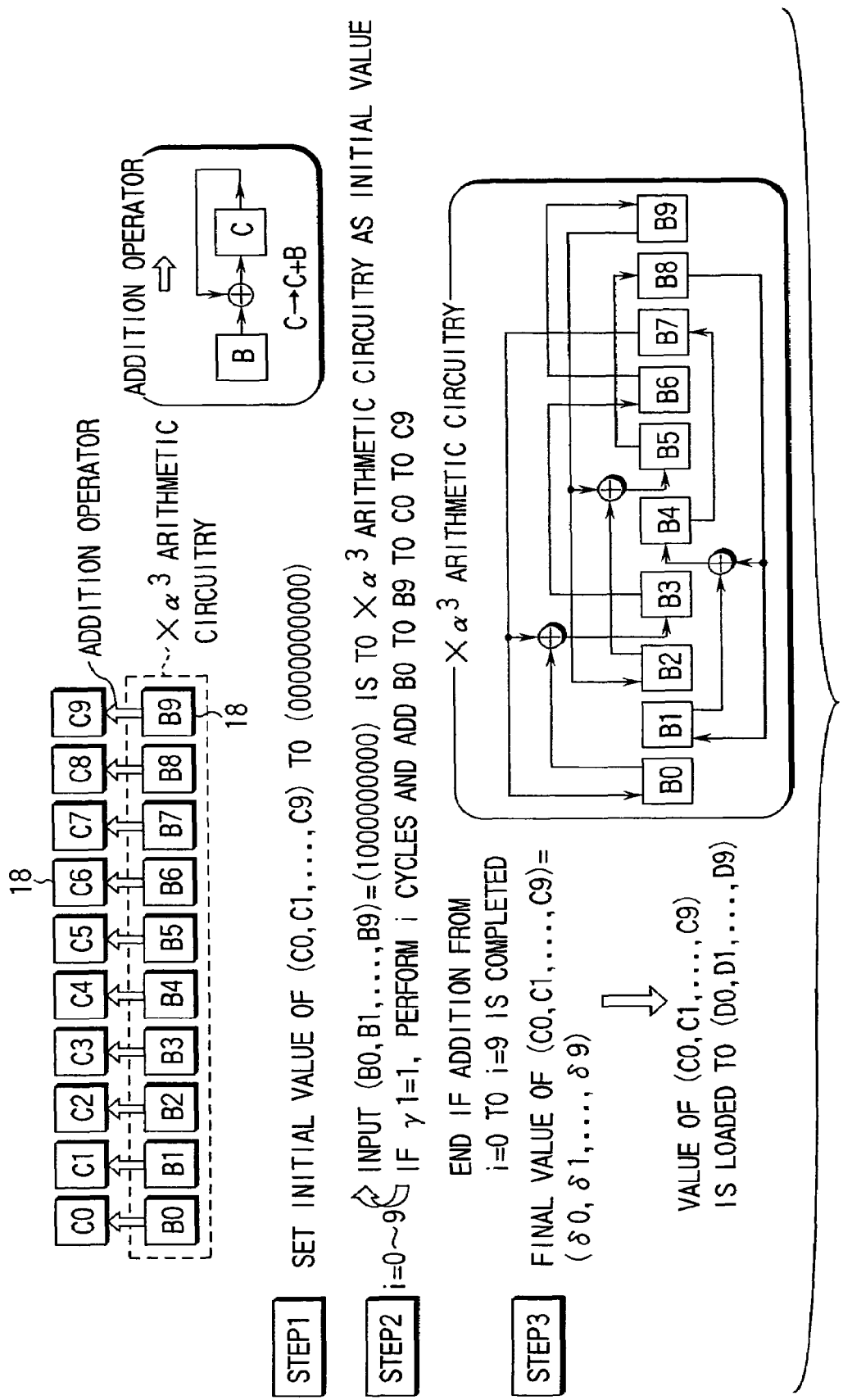
FIG. 12 is a figure, which shows the conversion circuit of syndrome S3 in the error correction circuit of FIG. 1.
Figure 13:
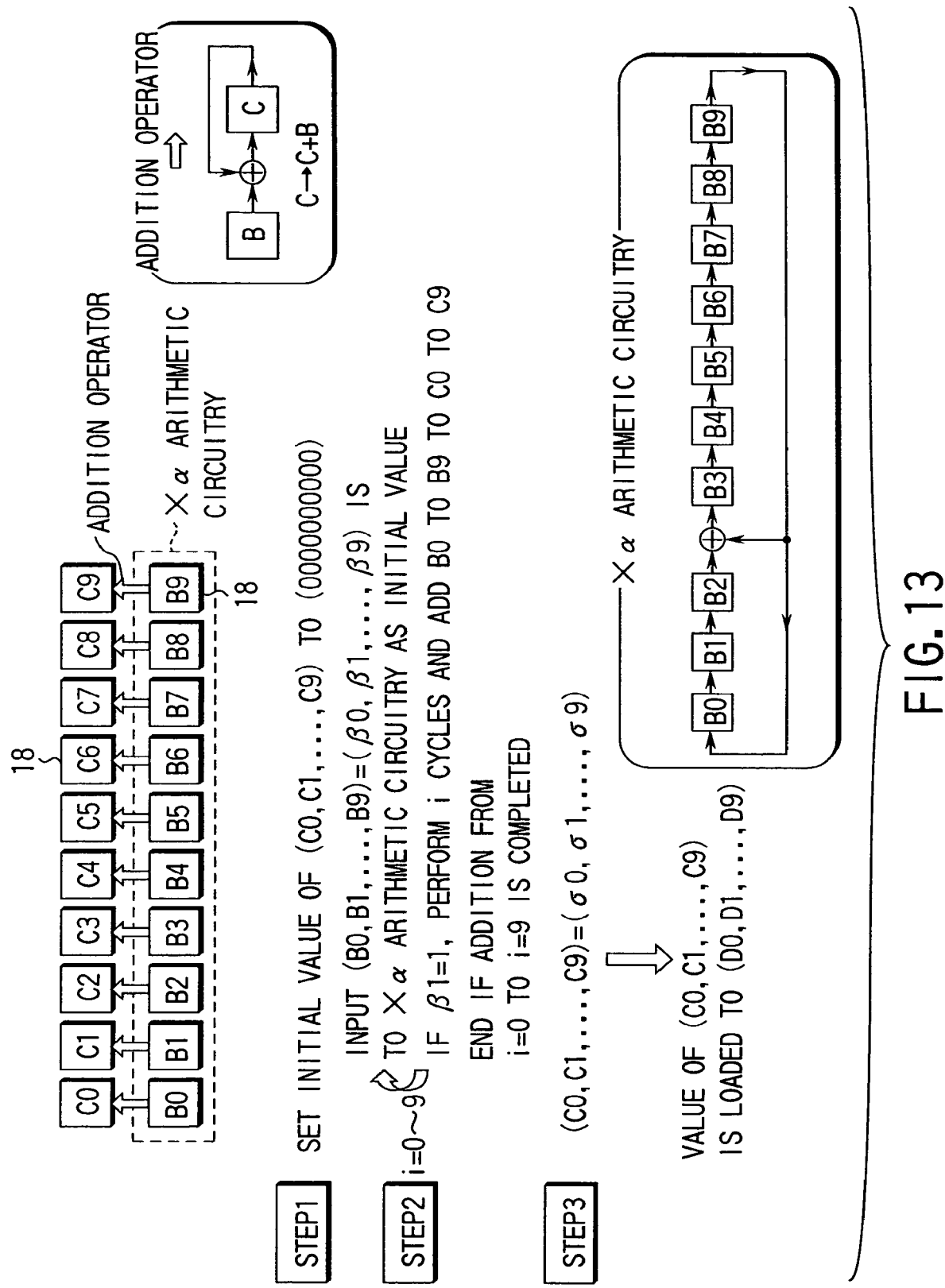
FIG. 13 is a figure, which shows the $\sigma 1 = S1 \times S1$ calculation circuit in the error correction circuit of FIG. 1.
Figure 14:
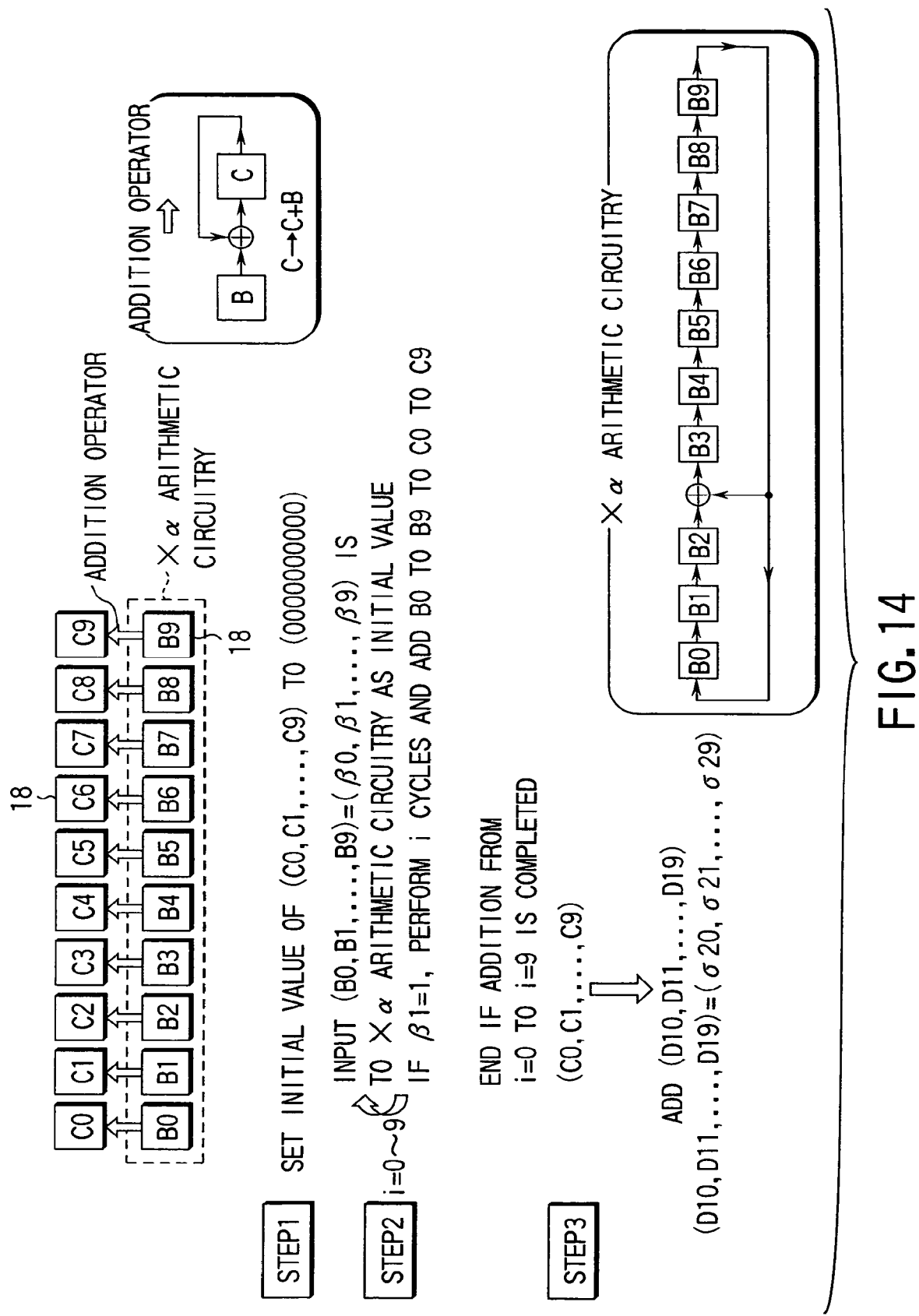
FIG. 14 is a figure, which shows the $\sigma 2 = S1 \times S \times S1 + S3$ calculation circuit in the error correction circuit of FIG. 1.
Figure 15:
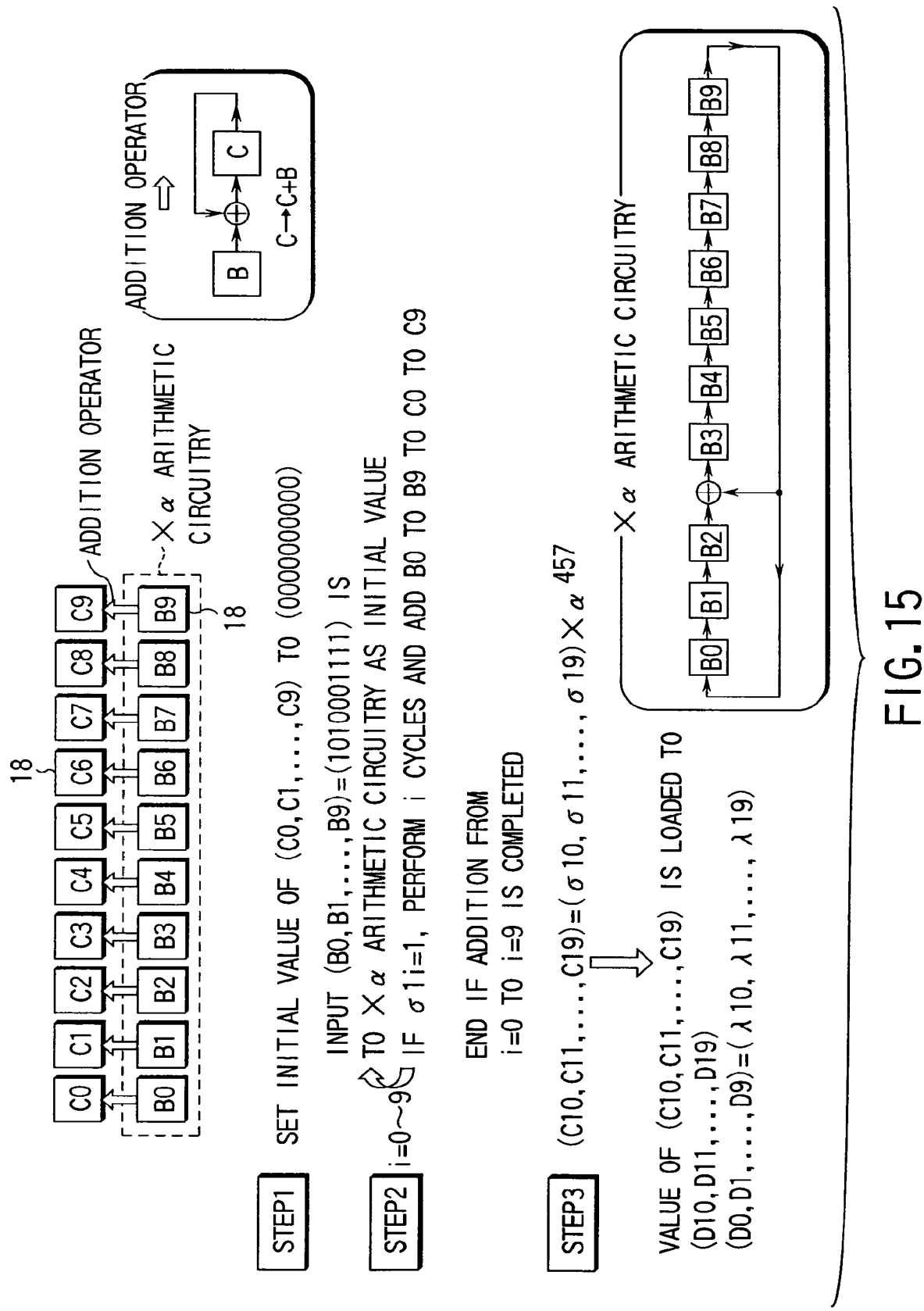
FIG. 15 is a figure, which shows the $\sigma 1 \rightarrow \lambda 1$ converter in the error correction circuit of FIG. 1.
Figure 16:
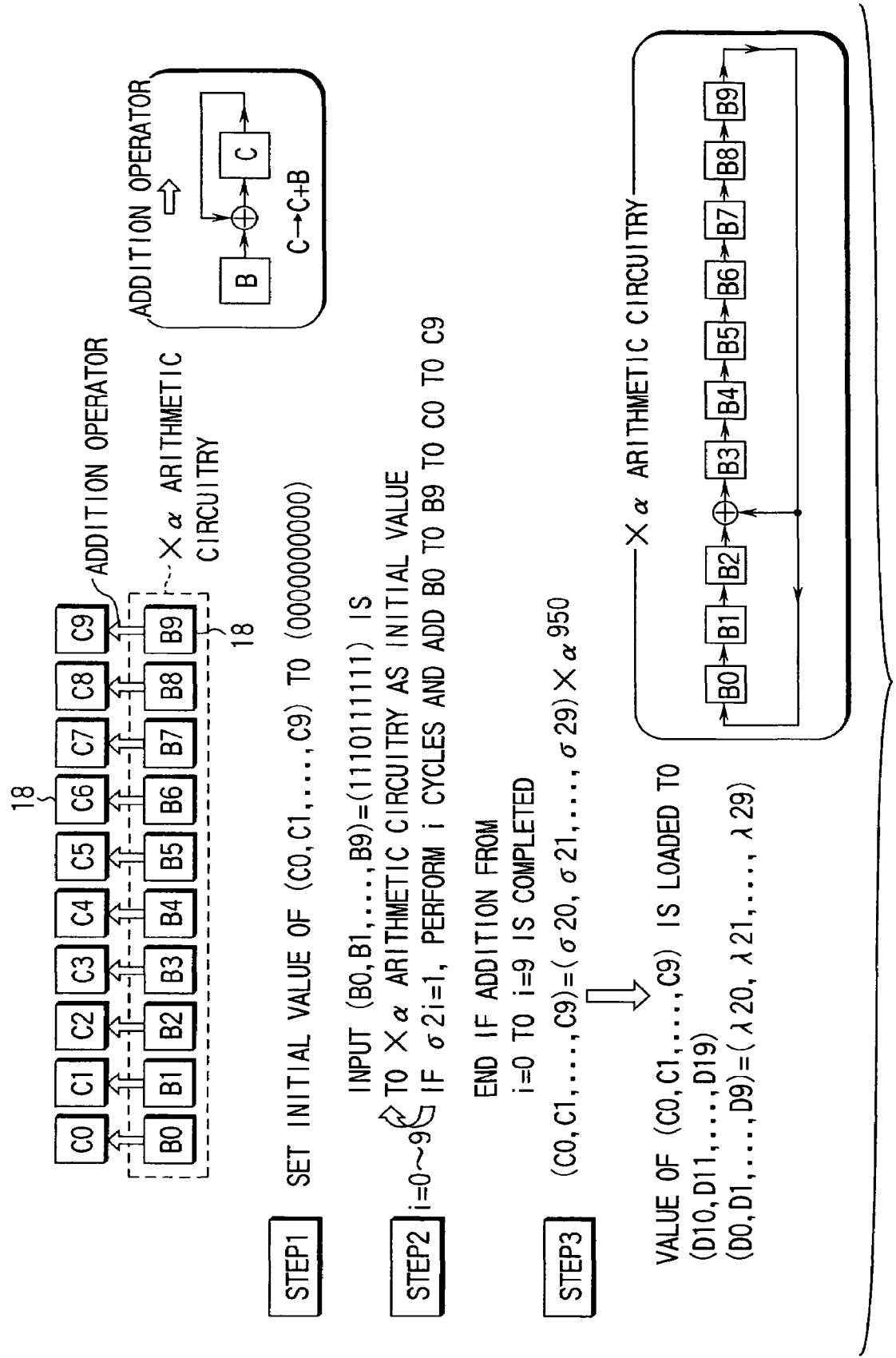
FIG. 16 is a figure, which shows the $\sigma 2 \rightarrow \lambda 2$ converter in the error correction circuit of FIG. 1.
Figure 17:
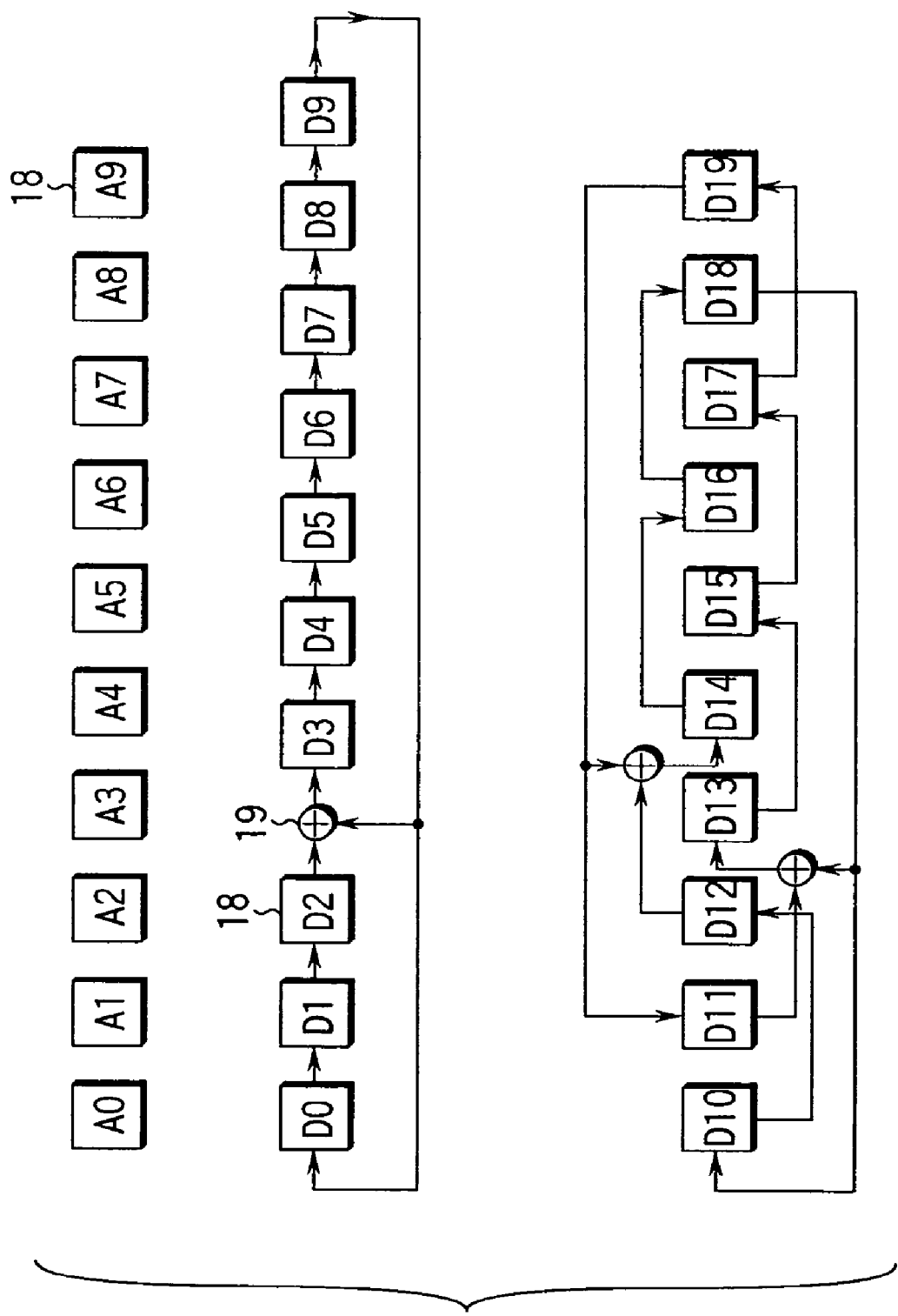
FIG. 17 is a figure, which the shows the error position detection circuit in the error correction circuit of FIG. 1.

FIG. 11 shows one syndrome S1 and S3 calculator, FIG. 12 shows one converter of syndrome S3, FIG. 13 shows one σ1 (=S1×S1) calculator, FIG. 14 shows one σ2 (=S1×S1×S1+ S3) calculator, FIG. 15 shows one σ1→λ1 converter, FIG. 16 shows one σ2→λ2 converter, and FIG. 17 shows one error position detector.

These circuits are chiefly constructed by 51 shift registers 18 shown by D0 to D19, P, A0 to A9, B0 to B9, and C0 to C9 and a plurality of logical operation circuits 19, and provided respectively corresponding to each signal line DL_0 to DL_7.

These circuits perform the error correction to the data read from the memory cell based on double error correction BHC (1023, 1003) code, and two so-called minimum polynomials M1 and M3 are $M1(x)=x^{10}+x^3+1 M3(x)=x^{10}+x^3+x^2+x+1$.

In the operation of error correction circuit 11, when a and b are added to c, a, b, and c are "0" or "1", respectively and all the arithmetic results are the arithmetic as follows.

TABLE 3

| a + b = c |
|---|
| "0" + "0" = "0" |
| "0" + "1" = "1" |
| "1" + "0" = "1" |
| "1" + "1" = "0" |

Operation is performed until the error and the preparation for the position detection is completed in synchronization with error correction control signal ECCLK generated by error correction control signal generation circuit 7.

Syndrome S1 and S3 calculator shown in FIG. 11 is, chiefly, constructed by 31 shift registers 18 shown by D0 to D19, P, and A0 to A9, and a plurality of logical operation circuits 19.

Logic of the read data read from the memory sector to data memory circuit 17 is reversed in IO buffer 6 and reversed data is output to signal lines DL_0 to DL_7.

All The register shown by D0 to D19 and P are reset to "0" before calculation. That is, an initial value is set to "0". Syndromes S1 and S3 with 20 bits are generated in shift register 18 shown by D0 to D19 after 548 cycles of the clock signal Φ. The parity calculation result of the read data is brought about in the register shown by P.

Column address signal CSL is generated in synchronization with error correction control signal ECCLK, the read data in 0 column addresses is taken into the first cycle of the clock signal Φ, hereinafter, sequentially, the read data in one column address in the second cycle, . . . , the read data in 547th column address is taken into the 548th cycle.

Switches SW4, SW6, and SW7 become turned off, and the dummy data "0" is taken at the cycle in 516th column address. The reason is write data of 516th address is calculated as the dummy data "0" when the check data is generated.

Syndrome S1 is memorized in the registers shown by A0 to A9. In the calculation here, syndrome S1 is memorized in the registers shown by D0 to D9, syndrome S3 is memorized in the registers shown by D10 to D19, and syndrome S1 is memorized in the registers shown by A0 to A9, and the parity of the read data is memorized in the register shown by P.

Since syndrome S3 obtained with syndrome S1 and S3 calculator shown in FIG. 11 is different the degree of the polynomial expression from syndrome S1, it is matched by the converter of syndrome S3 shown in FIG. 12.

The converter of syndrome S3 shown in FIG. 12 is chiefly constructed by 20 shift registers 18 shown by B0 to B9 and C0 to C9 and a plurality of logical operation circuits 19, and syndrome S3 is matched to syndrome S1.

First, all registers shown by C are reset to "0" in STEP1, and when the arithmetic of STEP2 is repeated ten times, the conversion value of S3 is caused in the register shown by C. This is memorized to the registers shown by D10 to D19.

In the calculation here, syndrome S1 is memorized in the registers shown by D0 to D9, syndrome S3 is memorized in the registers shown by D10 to D19, syndrome S1 is memorized in the registers shown by A0 to A9, and the parity of the read data is memorized in the register shown by P.

The calculator of syndrome S1×S1 shown in FIG. 13 is chiefly constructed by 20 shift registers 18 shown by B0 to B9 and C0 to C9 and a plurality of logical operation circuits 19, and calculates syndrome S1×S1. First, when all registers shown by C are reset to "0", and the arithmetic of STEP2 is repeated ten times, S1×S1 is caused in the register shown by C in STEP 1. This is memorized in the registers shown by D0 to D9.

In the calculation here, S1×S1 in the registers shown by D0 to D9, syndrome S3 is memorized in the registers shown by D10 to D19, syndrome S1 is memorized in the registers shown by A0 to A9, and the parity of the read data is memorized in the register shown by P.

The calculator of syndrome S1×S1×S1+S3 shown in FIG. 14 is chiefly constructed by 20 shift registers 18 shown by B0 to B9 and C0 to C9 and a plurality of logical operation circuits 19, and calculates syndrome S1×S1×S1+S3.

First, when all registers shown by C are reset to "0", and the arithmetic of STEP2 is repeated ten times, S1×S1×S1 (=S1^3) is caused in the register shown by C in STEP1. This is added to the data of the registers shown by D10 to D19 respectively, and is memorized.

In the calculation here, S1×S1 (=σ1) is memorized in the registers shown by D0 to D9, syndrome S1^3+S3 (=σ2) is memorized in the registers shown by D10 to D19, syndrome S1 is memorized in the registers shown by A0 to A9, and the parity of the read data is memorized in the register shown by P.

Though the error position detector can operate by using σ1 obtained with the calculator of syndrome S1×S1×S1+S3 shown in FIG. 14, since it takes time to access, σ1 is converted into λ1 with the σ1→λ1 converter shown in FIG. 15 to perform the access at high speed.

The σ1→λ1 converter shown in FIG. 15 is chiefly constructed by 20 shift registers 18 shown by B0 to B9 and C0 to C9 and a plurality of logical operation circuits 19, and converts σ1 into λ1.

First, all registers shown by C are reset to "0" in STEP1, when the arithmetic of STEP2 is repeated ten times, λ1 is caused in the register shown by C. This is memorized in the registers shown by D0 to D9.

In the calculation here, λ1 is memorized in the registers shown by D0 to D9, σ2 is memorized in the registers shown by D10 to D19, syndrome S1 is memorized in the registers shown by A0 to A9, and the parity of the read data is memorized in the register shown by P.

Though the error position detector can operate even like σ2 obtained with the σ1→λ1 converter shown in FIG. 15, since it takes time to access, σ2 is converted into λ2 with the σ2→λ2 converter shown in FIG. 16 to perform the access at high speed.

The σ2→λ2 converter shown in FIG. 16 is chiefly constructed by 20 shift registers 18 shown by B0 to B9 and C0 to C9 and a plurality of logical operation circuits 19, and converts σ2 into λ2.

First, all registers shown by C are reset to "0" in STEP1, when the arithmetic of STEP2 is repeated ten times, λ2 is caused in C register shown by C. This is memorized in the registers shown by D10 to D19.

In the calculation here, λ1 is memorized in the registers shown by D0 to D9, λ2 is memorized in the registers shown by D10 to D19, syndrome S1 is memorized in the registers shown by A0 to A9, and the parity of the read data is memorized in the register shown by P.

The error position detector shown in FIG. 17 is chiefly constructed by 30 shift registers 18 shown by D0 to D19, A0 to A9, and a plurality of logical operation circuits 19.

This error position detector detects the error position by using syndrome λ1 memorized in the register shown by D0 to D9, λ2 memorized in the register shown by D10 to D19, and S1 memorized in the registers shown by A0 to A9, and operates by the clock signal Φ generated in synchronization with output control signal OUTCLK generated in output control signal generation circuit 8. In this case, when the following conditional expression of A0=D0+D10A1=D1+D11A2=D2+D12A3=D3+D13A4=D4+D14A5=D5+D15A6=D6 +D16A7=D7+D17A8=D8+D18A9=D9+D19 is approved, the read data output from data memory circuit 17 to D0 terminal to D7 through each signal lines DL_0 to DL_7 is reversed, and the error correction is performed.

If the conditional expression is approved after one cycle of the clock signal Φ (one cycle of the error position arithmetic), the read data in 0 column address is erroneous.

In a detailed example, when the error position detection circuit of signal line DL_3 approves the conditional expression with the 200th cycle of the clock signal Φ (200th cycle of the error position arithmetic), for example, it is detected 199th column address has the error.

Figure 18:
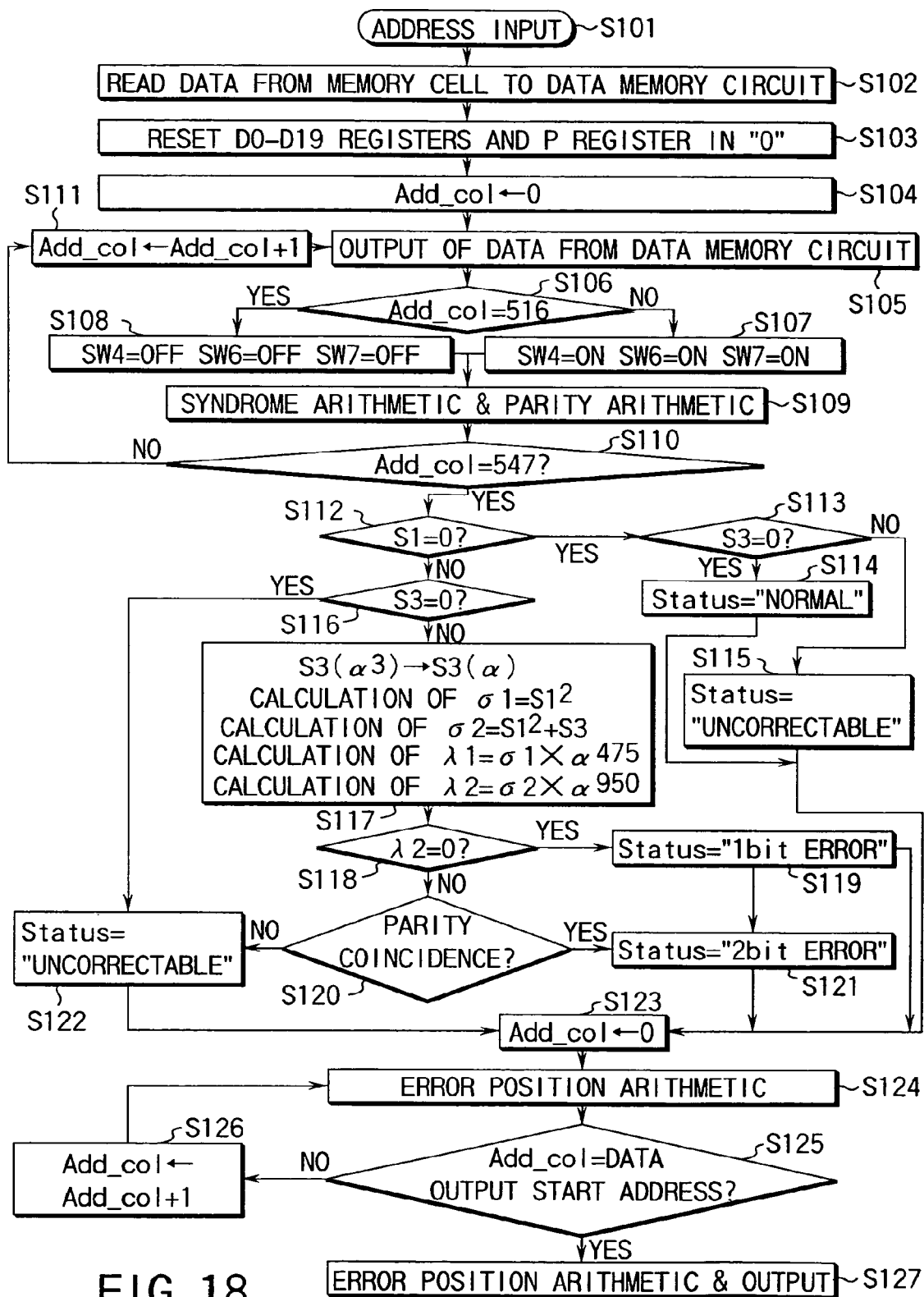
FIG. 18 is a figure, which shows an example of read algorithm in the first embodiment.

FIG. 18 shows an example of the algorithm, in which the error position detection and correction is performed from the read data with error correction circuit 11 of the FIG. 1.

First, the memory sector and start column address data, to which reading are started, are input (step S101). Next, data is read from the memory sector to data memory circuit 17 (step S102). Next, the register shown by D0 to D19 and the register shown by P are reset to "0" (step S103). Next, the content of variable column address register Add_col is set to 0 (step S104). This variable column address register Add_col is in column address generation circuit 16, and generates column address signal CSL according to the content of this variable column address register Add_col.

Next, the read data is output from the data memory circuit 17 selected by the column address (step S105). And, it is judged whether the content of variable column address register Add_col is 516 (step S106), switch SW4, SW6, and SW7 are turned off (step S108), when the content of variable column address register Add_col is 516, switch SW4, SW6, and SW7 are turned on if the content of variable column address register Add_col is not 516 (step S107).

Next, arithmetic of the syndrome and parity is performed (step S109) by the clock signal Φ generated in synchronization with error correction control signal ECCLK. And, it is judged the content of variable column address register Add_col is equal to 547 (step S110), and process is moved to step S111 if it is not 547, and the content of variable column address register Add_col is advanced by one and flowchart is returned to step S105. Thus, the arithmetic of the syndrome and parity is repeated while incrementing it by one until the content of variable column address register Add_col becomes equal to 547. Above-mentioned operations of steps S105 to S111 are performed in synchronization with error correction control signal ECCLK.

And, when it is judged the content of variable column address register Add_col is equal to 547 (step S110), it is judged syndrome S1 is 0 (step S112). As a result of this judgment, if S1 is equal to 0, it is judged whether S3 is equal to 0 (step S113). Status is set in "NORMAL", when it is judged it is faultless if the result of this judgment is S3=0 (step S114).

On the other hand, if the result of the judgment in step S112 is S1=0, and the result of the judgment in step S113 is S3≠0, status is set in "INCORRECTABLE" by judging the error in three bits or more is caused (step S115).

On the other hand, if the result of the judgment in step S112 is S1≠0, it is judged whether S3 is equal to 0 (step S116). If the result of this judgment is S3=0, status is set in "INCORRECTABLE" by judging the error in three bits or more is caused (step S122). If the result of the judgment in step S116 is S3≠0, conversion of S3, calculation of σ1, calculation of σ2, calculation of λ1, and calculation of λ2 are performed (step S117).

Next, it is judged whether λ2 is 0(step S118). If the result of this judgment is λ2=0, it is judged the error by one bit is caused, and "ONE BIT ERROR" is set in status (step S119).

On the other hand, if the result of the judgment in step S118 is λ2≠0, it is judged whether the parity generated from the write data is coincide with the parity generated from the read data (step S120). As a result of this judgment, if parities are coincide, it is judged the error by two bits is caused, and "TWO BITS ERROR" is set in status (step S121). As a result of this judgment in step S120, if parities are not coincide, it is judged that the error in three bits or more is caused, and "INCORRECTABLE" is set in status (step S122). And, when status is fixed, the content of variable column address register Add_col is set to 0 again (step S123). The operations of above-mentioned steps S112 to S123 and S105 to S111 are performed in synchronization with error correction control signal ECCLK.

Next, the error position arithmetic is performed in one cycle (step S124), and it is judged whether the content of variable column address register Add_col is coincide with the column address of the data output start (step S125). As a result of this judgment, process is moved to step S126 if not coincide, and content of variable column address register Add_col is advanced by one, and flowchart is returned to step S124. Thus, the content of variable column address register Add_col is incremented by one until it is coincide with the column address of the data output start, and steps S124 to S126 are repeated. Operations of above-mentioned steps S124 to S126 is performed in synchronization with the clock signal Φ generated in synchronization with error correction control signal ECCLK.

If it is judged that the content of variable column address register Add_col is coincide with the column address of the data output start by step S125, the error position arithmetic is performed in synchronization with OUTCLK generated in synchronization with read enable signal nRE, and data is output to the external device according to the content of variable column address register Add_col (step S127).

The error position arithmetic and data output are repeated requested times from the external device by read enable signal nRE. It is possible to output at high speed by examining whether it is necessary to correct output data like this in a previous cycle. Output processing and judging processing to be corrected may be performed at the same cycle when the high-speed output is not required.

Figure 19:
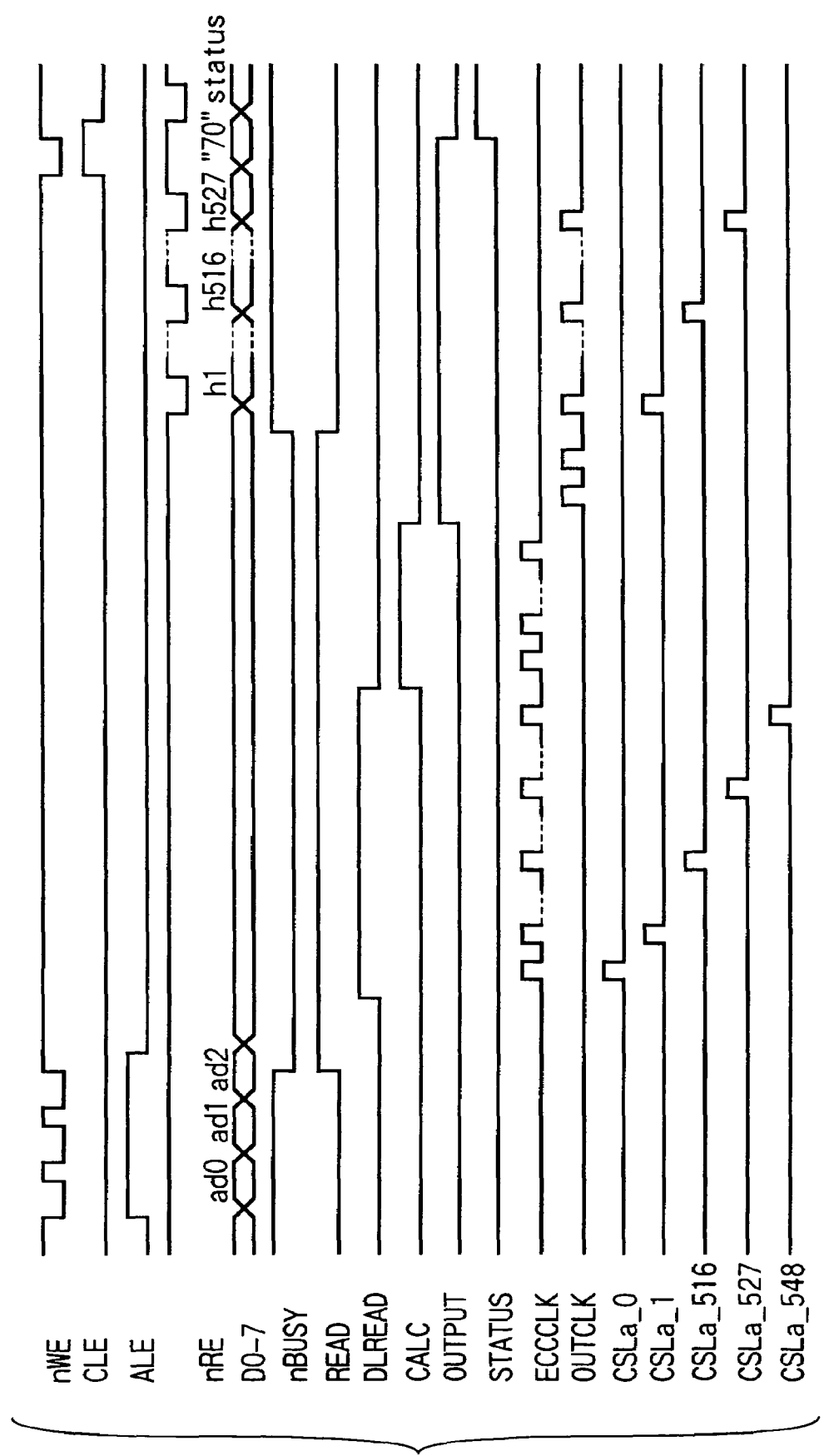
FIG. 19 is a figure, which shows an example of timing of read operation in read algorithm of FIG. 18.

FIG. 19 shows an example of the timing of the data read operation in the algorithm shown in FIG. 18.

In FIG. 19, first, address data ad0 to ad2, which specify the selection of the memory sector and the data output start column address, are input at raise of write enable signal nWE in the period when address latch enable signal ALE is "H", (step S101 of FIG. 18).

When address data ad2 is taken, read instruction signal READ automatically becomes "H", and the data of the memory cell is read from the selected memory sector to data memory circuit 17 (step S102 of FIG. 18). The registers shown by D0 to D19 and the register shown by P are reset to "0" meanwhile (step S103 of FIG. 18), and the content of variable column address register Add_col is set to 0(step S104 of FIG. 18).

Variable column address register Add_col is in column address generation circuit 16, and column address signal CSL is generated according to the content of this variable column address register Add_col.

When the data read to data memory circuit 17 ends, data latch read instruction signal DLREAD becomes "H", and as a result, error correction control signal ECCLK is output. The read data is sequentially output from the data memory circuit 17 selected by the column address to error correction circuit 11 from 0th column address to 547th column address in synchronization with error correction control signal ECCLK, and the calculation of the syndrome and parity is performed (steps S105 to S111 of FIG. 18).

Subsequently, calculation instruction signal CALC becomes "H", and error correction control signal ECCLK is output again. The error detection of the read data is performed in synchronization with error correction control signal ECCLK (steps S112 to S122 of FIG. 18).

Data output instruction signal OUTPUT becomes "H" when CALC becomes "L", output control signal OUTCLK is output, and the output preparation to the external device is performed (steps S123 to S126 of FIG. 18). Since the data output start column address is "1" address in the example of FIG. 19, the error position arithmetic (step S124 of FIG. 18) is performed twice.

Thereafter, read instruction signal READ becomes "L", and the output to the external device becomes possible. Busy signal nBUSY is "L", and preparation of the output to the external device is informed when read instruction signal READ is "H".

Output control signal OUTCLK becomes from "L" to "H" according to the timing that read enable signal nRE changes from "H" to "L", column address signal CSL is output, and the output is started from D0 terminal to D7 terminal corresponding to read data D0 to D7. At the same time, the error position arithmetic is performed to detect whether the output data of the following column address has an error (step S127 of FIG. 18).

When the hexadecimal code "70"H, which is the status read instructions, is input at raise of write enable signal nWE in the period when command latch enable signal CLE is "H", the status set as described in steps S114, S115, S119, S121, and S122 of FIG. 18 is output. If the above-mentioned status read instruction "70"H is input, status read instruction signal STATUS becomes "H". This status read instruction signal STATUS is received, at nCE="L", output is started from D0 terminal to D7 terminal of status in the timing when read enable signal nRE changes from "H" to "L". The output is performed as following Table 4, by using the output from D0 terminal to D2 terminal, for example,.

TABLE 4

| Status | write | 1-bit error | 2-bits error | incorrectable |
|---|---|---|---|---|
| D0 | 0 | 0 | 0 | 1 |
| D1 | 0 | 1 | 0 | 1 |
| D2 | 0 | 0 | 1 | 1 |

The status data of the register shown by D0 means whether read operation including the error correction is succeeded (0="PASS"/1="FAIL"). When status read is performed after write/erase, 0 is output if succeeding and 1 is output if not succeeding.

The status data of the register shown by D0 is made common as status data of reading/writing/the erasure. The register shown by D1 and the register shown by D2 show the maximum number of errors.

The circuits of FIG. 11 to FIG. 17 are provided corresponding to each of signal lines DL_0 to DL_7, and the number of errors can be obtained therefrom since they operate at the same time. The maximum number of errors is output as status.

Figure 20:
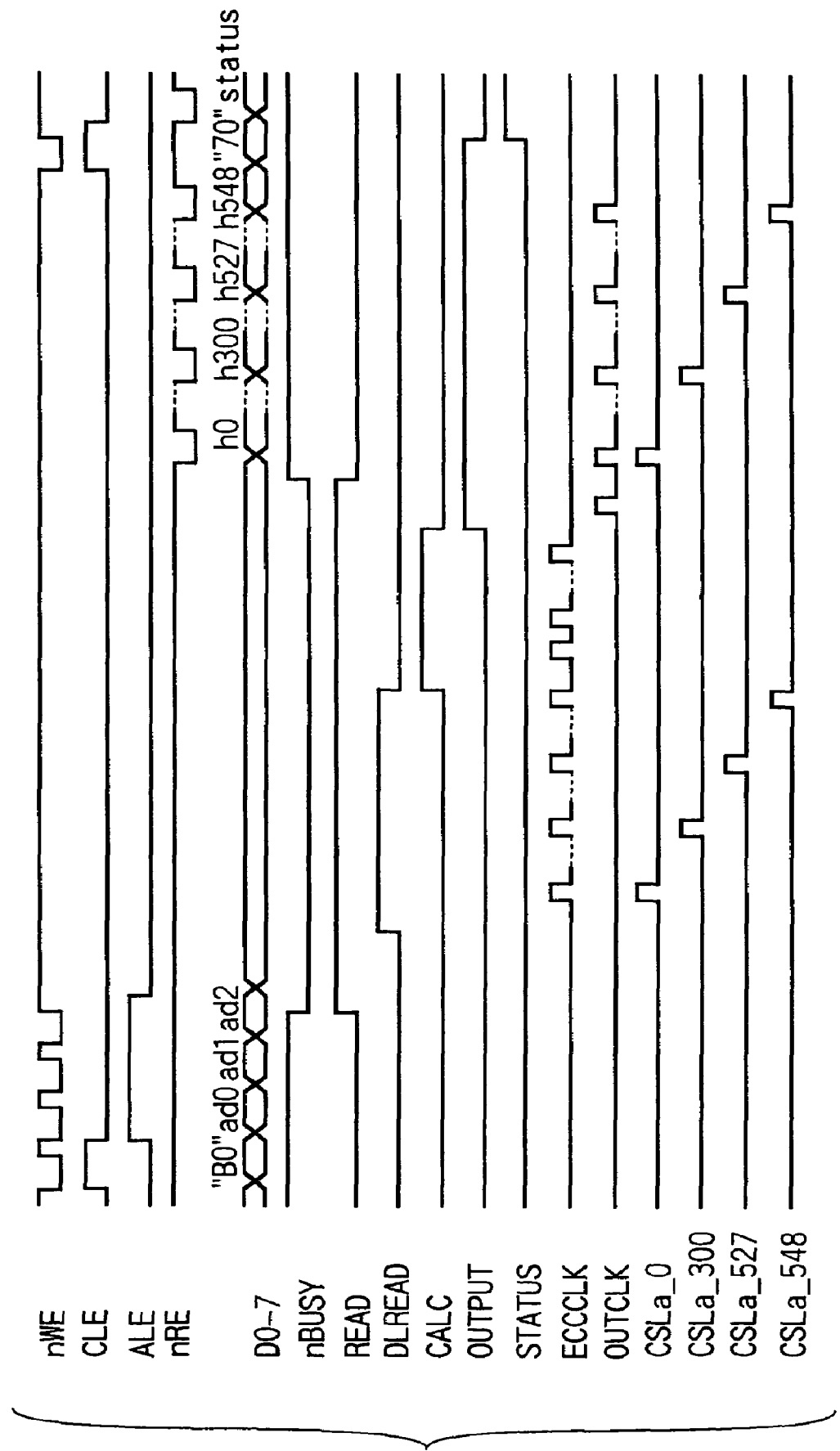
FIG. 20 is a figure, which shows an example of the operation to output read data without performing error correction in read algorithm of FIG. 18.

FIG. 20 shows an example of the timing of operation, which output the read data without performing the error correction in the algorithm shown in FIG. 18.

In the example here, the check data and the parity data are output. As a result, the operation of error correction circuit 11 can be checked by the external device.

That is, in FIG. 20, first, the hexadecimal code "B0"H, which is the error correction deactivation instruction, is input at raise of write enable signal nWE in the period when command latch enable signal CLE is "H". The same command as the error correction deactivation instruction "A0"H at the time of writing may be used as this error correction deactivation instruction.

The timing of the operation shown in FIG. 20 is almost the same as the timing of the operation shown in FIG. 19. The difference is that (1) "B0"H command is entered, (2) output data without correction even when the error data is detected, and (3) the check data and the parity data are output.

Figure 21:
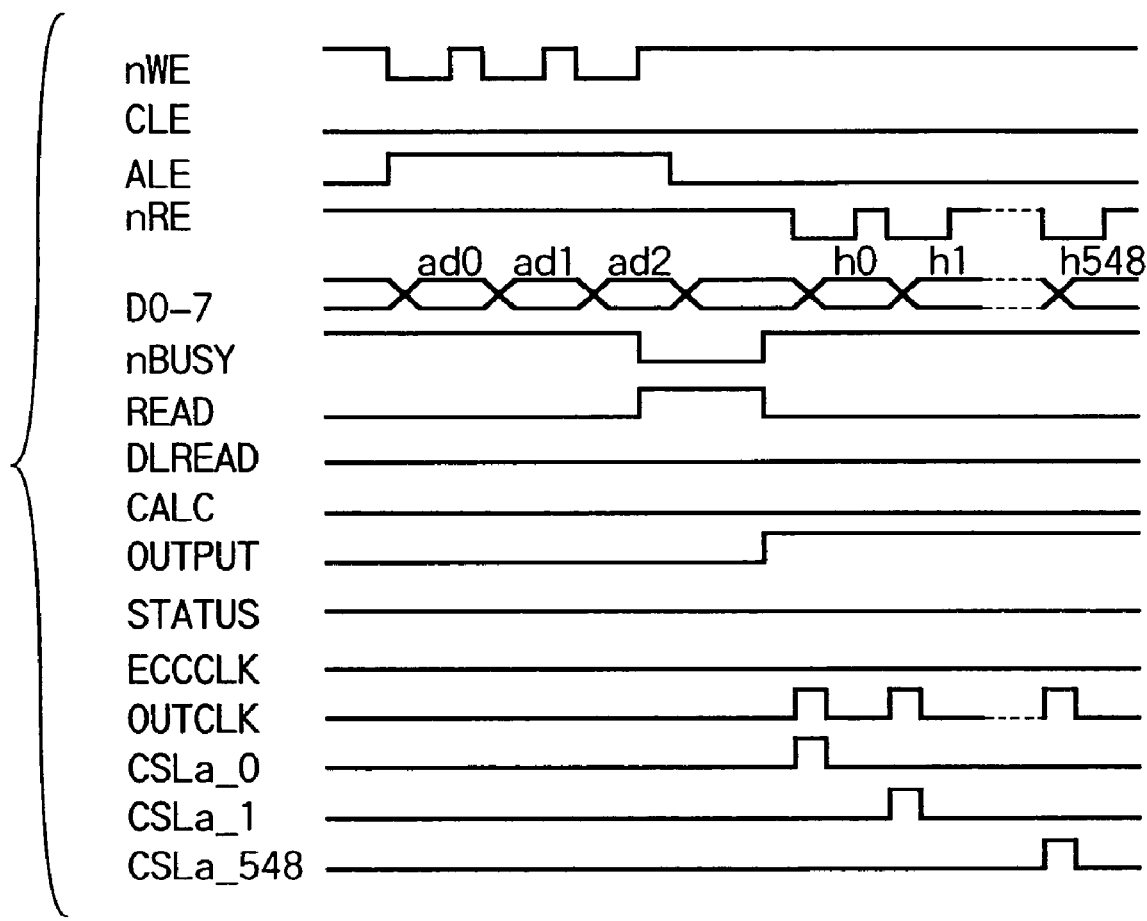
FIG. 21 is a figure, which shows an example of timing of data read operation when it assumes error correction activation signal ECCENB to be "L" in read algorithm of FIG. 18.

FIG. 21 shows an example of the timing of the data read operation when error correction circuit activation signal ECCENB input to the terminal ECCENB is set to "L".

It is assumed error correction circuit activation signal ECCENB is "L", command interface 3 in FIG. 1 switches to deactivate error correction circuit 11.

That is, in FIG. 21, address data ad0 to ad2, which specify the selection of the memory sector and the data output start column address, are input at raise of write enable signal nWE in the period when address latch enable signal ALE is "H".

Read instruction signal READ automatically becomes "H" when address data ad2 is taken, and the data of the memory cell is read from the selected memory sector to data memory circuit 17. Thereafter, read instruction signal READ becomes "L", and the output to the external device becomes enabled. Data output instruction signal OUTPUT becomes "H", and the output of output control signal OUTCLK becomes possible. Preparing the output to the external device is informed, by making busy signal nBUSY is "L", and preparation of the output to the external device is informed when read instruction signal READ is "H".

In the timing that read enable signal nRE changes from "H" to "L", output control signal OUTCLK becomes from "L" to "H" and column address signal CSL is output, and read data D0 to D7 starts output from D0 terminal to D7 terminal.

Figure 22:
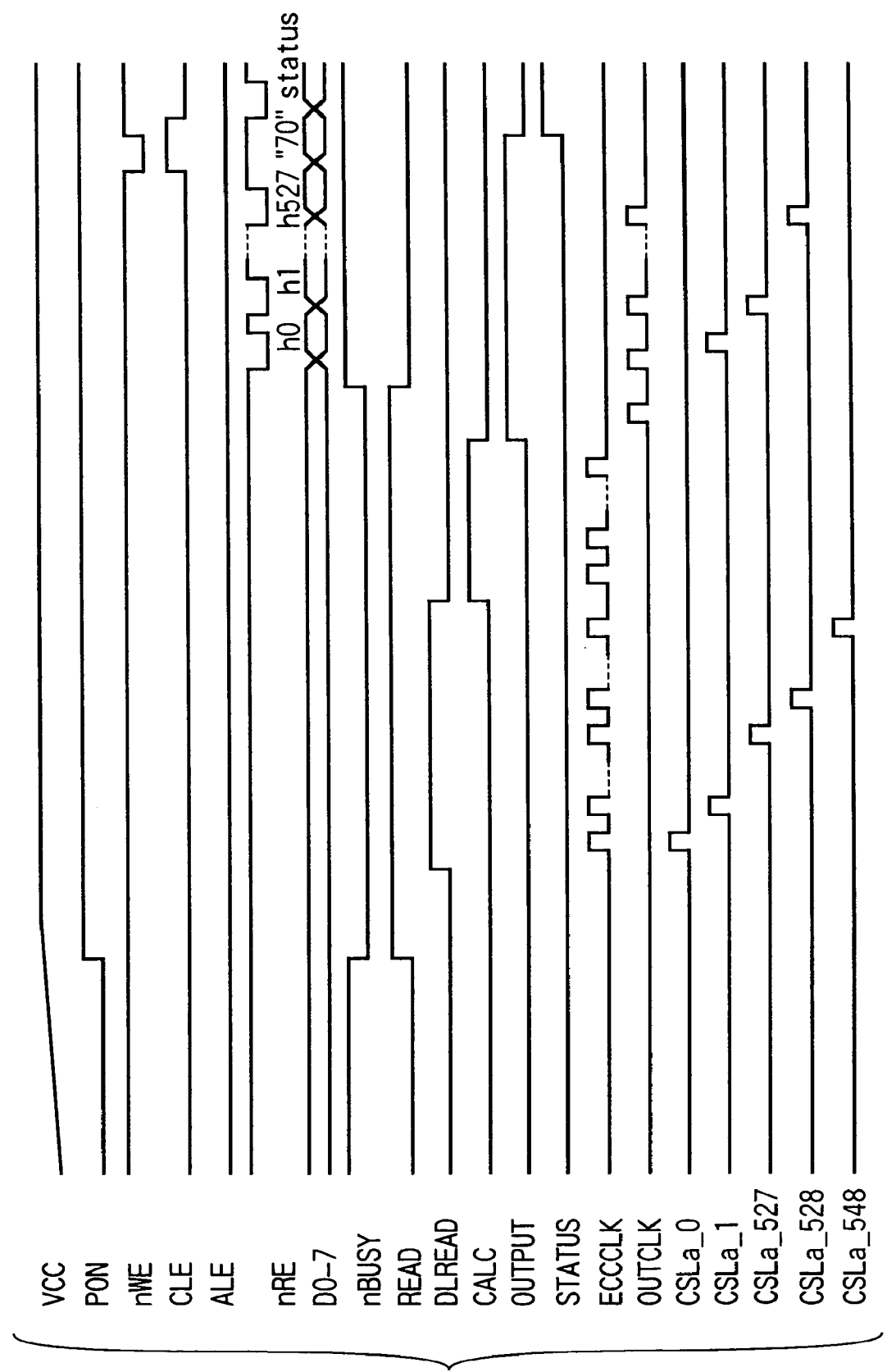
FIG. 22 is a figure, which shows an example of timing of operation to automatically read memory sector of predetermined address at the time of power supply being turned on in system shown in FIG. 3.

FIG. 22 shows an example of the timing of operation, which automatically reads the memory sector of a predetermined address in the system, which shows in FIG. 3 at the time of raise of the power supply.

That is, in FIG. 22, when power-supply voltage VCC raises from 0V and reaches the predetermined voltage value, power on detection circuit 2 makes power on detection signal PON "H". Command interface 3 receives the transition of the above-mentioned power on detection signal PON to from "L" to "H", automatically makes read instruction signal READ "H", and starts reading. Address buffer 4 also receives the transition from "L" of the power on detection signal PON to "H", and sets the address data in the predetermined value automatically. In this example, the data output start column address is set in "0"address.

The timing of the operation shown in FIG. 22 is almost the same as the timing of the operation shown in FIG. 19, the difference is to be started by power on detection signal PON.

Second Embodiment

The second embodiment differs from the first embodiment only in read operation.

The circuit configuration of the flash memory, which equips the error correction circuit, according to the second embodiment is almost similar to the circuit configuration shown in FIG. 1, and, in addition, the point to receive the error correction instruction from the external device and output error correction read instruction signal ECREAD from the command interface 3 is different.

Figure 23:
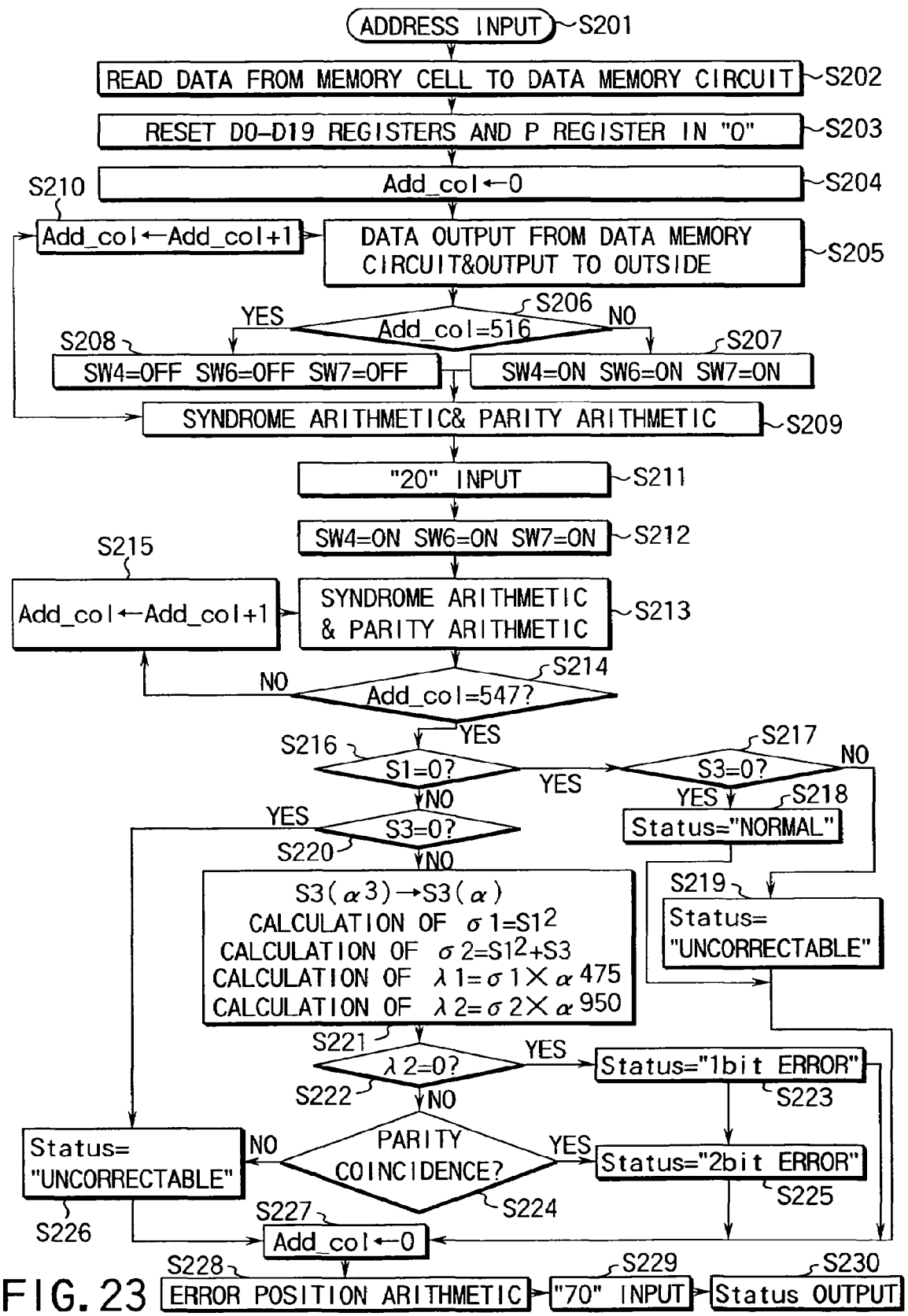
FIG. 23 is a figure, which shows an example of read algorithm in the second embodiment.

FIG. 23 shows an example of algorithm, which performs the error position detection and correction from the read data with error correction circuit 11 of the FIG. 1, in the second embodiment, and differs from the algorithm, which performs the error position detection and correction from the read data with error correction circuit 11 of the FIG. 1, in the first embodiment referring to FIG. 18.

That is, first, the memory sector and the start column address data, which starts reading, is input (step S201). Next, data is read from the memory sector to data memory circuit 17 (step S202). Next, the registers shown by D0 to D19 and the register shown by P are reset to "0" (step S203). Next, the content of variable column address register Add_col is set to 0 (step S204). This variable column address register Add_col is in column address generation circuit 16, and column address signal CSL is generated according to this content.

Next, the read data from the data memory circuit 17 selected by the column address is output to the external device (step S205). And, it is judged whether the content of variable column address register Add_col is 516 or not (step S206), switches SW4, SW6, and SW7 are turned off (step S208) if the content is 516, and switches SW4, SW6, and SW7 are turned on if the content is not 516 (step S207).

Next, arithmetic of the syndrome and parity is performed (step S209) by the clock signal Φ generated in synchronization with output control signal OUTCLK, which synchronizes with read enable signal nRE from the external device. And, the content of variable column address register Add_col is advanced by one and flowchart is returned to step S205 (step S210). Thus, the arithmetic of the syndrome and parity is repeated while incrementing by one, until the content of variable column address register Add_col becomes 527. Operations of above-mentioned steps S205 to S210 are performed in synchronization with output control signal OUTCLK.

Next, if the hexadecimal code "20"H is input to command interface 3, for example, as an error read instruction, it becomes error correction operation by correction read instruction signal ECREAD (step S211). And, switch SW4, SW6, and SW7 are turned on (step S212). In addition, arithmetic of the syndrome and parity is performed (step S213) by the clock signal Φ generated in synchronization with error correction control signal ECCLK.

It is judged whether the content of variable column address register Add_col is 547 (step S214), and process is moved to step S215, then, the content is incremented by one, and flowchart is returned to step S213 if the content is not 547. Thus, the arithmetic of the syndrome and parity is repeated while incrementing by one, until the content of variable column address register Add_col becomes 547. The operations of above-mentioned steps S213 to S215 and S105 to S111 are performed in synchronization with error correction control signal ECCLK.

And, when it is judged the content of variable column address register Add_col is equal to 547 (step S214), it is judged syndrome S1 is 0 (step S216). As a result of this judgment, if S1 is equal to 0, it is judged whether S3 is equal to 0 (step S217). Status is set in "NORMAL", when it is judged it is faultless if the result of this judgment is S3=0 (step S218).

On the other hand, if the result of the judgment in step S216 is S1=0, and the result of the judgment in step S217 is S3≠0, status is set in "INCORRECTABLE" by judging the error in three bits or more is caused (step S219).

On the other hand, if the result of the judgment in step S216 is S1≠0, it is judged whether S3 is equal to 0 (step S220). If the result of this judgment is S3=0, status is set in "INCORRECTABLE" by judging the error in three bits or more is caused (step S226). If the result of the judgment in step S116 is S3≠0, conversion of S3, calculation of σ1, calculation of σ2, calculation of λ1, and calculation of λ2 are performed (step S221).

Next, it is whether judged λ2 is 0 (step S222). If the result of this judgment is λ2=0, it is judged the error by one bit is caused, and "ONE BIT ERROR" is set in status (step S223).

On the other hand, if the result of the judgment in step S118 is λ2≠0, it is judged whether the parity generated from the write data is coincide with the parity generated from the read data (step S224). As a result of this judgment, if parities are coincide, it is judged the error by two bits is caused, and "TWO BITS ERROR" is set in status (step S225).

On the other hand, as a result of this judgment in step S224, if parities are not coincide, it is judged that the error in three bits or more is caused, and "INCORRECTABLE" is set in status (step S226). And, when status is fixed, the content of variable column address register Add_col is set to 0 again (step S227). The operations of above-mentioned steps S216 to S228 are performed in synchronization with error correction control signal ECCLK.

When the hexadecimal code "70"H, which is the status read instruction, is input at raise of write enable signal nWE in the period when command latch enable signal CLE is "H" (step S229), the status set as described in steps S218, S219, S223, S225, and S226 is output (step S230).

When the status read instruction "70"H is input, status read instruction signal STATUS becomes "H". That is, if the status read instruction "70"H is input, status read instruction signal STATUS becomes "H". This status read instruction signal STATUS is received, at chip enable signal nCE="L", status is output from D0 terminal to D2 terminal in step S230 as shown in, for example, Table 4, in the timing when read enable signal nRE changes from "H" to "L"

Since there is no error, usually, "Normality" is output as status, and reading end. If 1-bit error or 2-bits error is output as status, the read data is output again. At this time, data is corrected and output. If the status of "INCORRECTABLE" is output, read operation is end, and CPU 21 recognizes that the memory sector, which becomes impossible to correct, is destroyed.

Figure 24:
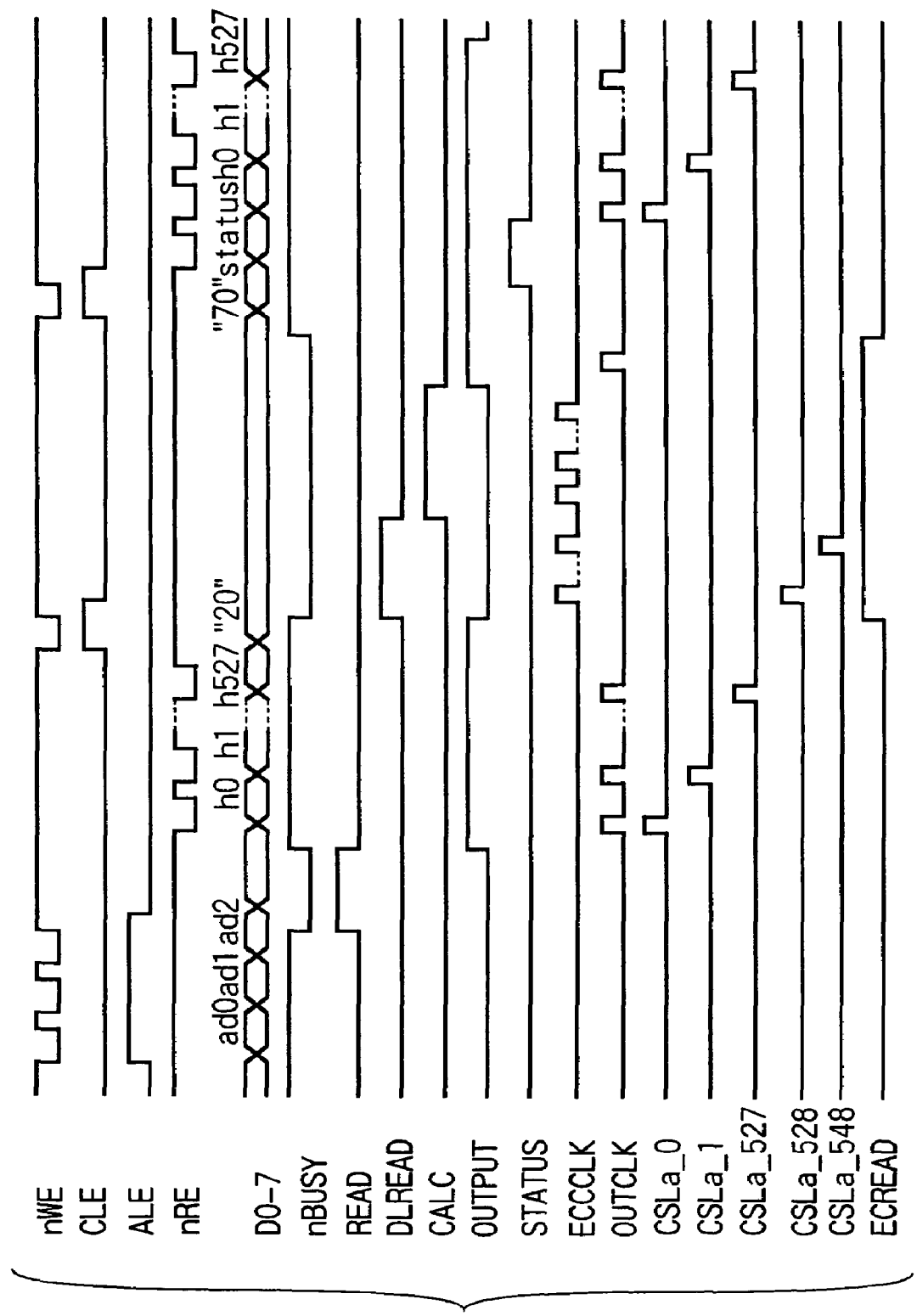
FIG. 24 is a figure, which shows an example of timing of read operation in read algorithm of FIG. 23.

FIG. 24 shows an example of the timing of the data read operation in the algorithm shown in FIG. 23.

Address data ad0 to ad2, which specify the selection of the memory sector and the data output start column address, are input at raise of write enable signal nWE in the period when address latch enable signal ALE is "H" (step S201 of FIG. 23).

Read instruction signal READ automatically becomes "H" when address data ad2 is taken, and the data of the memory cell is read from the selected memory sector to data memory circuit 17 (step S202 of FIG. 23). The registers shown by D0 to D19 and the register shown by P are reset to "0" meanwhile (step S203 of FIG. 23), and the content of variable column address register Add_col is set to 0 (step S204 of FIG. 23). This variable column address register Add_col is in column address generation circuit 16, and column address signal CSL is generated according to this content. Busy signal nBUSY is "L", and preparation of the output to the external device is informed when read instruction signal READ is "H".

When the data read to data memory circuit 17 ends, data output instruction signal OUTPUT becomes "H", and as a result, output control signal OUTCLK is output in synchronization with read enable signal nRE. The read data is sequentially output from the data memory circuit 17 selected by the column address to error correction circuit 11 from 0th column address to 527th column address in synchronization with output control signal OUTCLK, and the calculation of the syndrome and parity is performed (steps S205 to S210 of FIG. 23).

When the correction read instruction "20"H is input (step S211 of FIG. 23), error correction read instruction signal ECREAD becomes "H", according to this, data latch read instruction signal DLREAD becomes "H", as a result, error correction control signal ECCLK is output. The read data is sequentially output from the data memory circuit 17 selected by the column address to error correction circuit 11 from 528th column address to 547th column address in synchronization with error correction control signal ECCLK, and the calculation of the syndrome and parity is performed (steps S212 to S215 of FIG. 23).

Subsequently, calculation instruction signal CALC becomes "H", and error correction control signal ECCLK is output again. The error detection of the read data is performed in synchronization with error correction control signal ECCLK (steps S216 to S226 of FIG. 23).

When calculation instruction signal CALC becomes "L", Data output instruction signal OUTPUT becomes "H", output control signal OUTCLK is output, and the output preparation to the external device is performed (steps S227 and S228 of FIG. 23). Error correction read instruction signal ECREAD becomes "L" and the correction read operation ends. Busy signal nBUSY is "L", and preparation of the output to the external device is informed when error correction read instruction signal ECREAD is "H".

When the hexadecimal code "70"H, which is the status read instruction, is input at raise of write enable signal nWE in the period when command latch enable signal CLE is "H" (step S229 of FIG. 23), the status set as described in steps S218 of FIG. 23, S219, S223, S225, and S226 is output in step S230 of FIG. 23. In this case, if the status read instruction "70"H is input, status read instruction signal STATUS becomes "H". This status read instruction signal STATUS is received, at chip enable signal nCE="L", status is output from D0 terminal to D2 terminal as shown in, for example, Table 4, in the timing when read enable signal nRE changes from "H" to "L"

If the status is status of 1-bit error or 2-bits error, output control signal OUTCLK becomes from "L" to "H" according to the timing that read enable signal nRE change from "H" to "L", column address signal CSL is output, and the output of the read data is started from D0 terminal to D7 terminal. At the same time, the error position arithmetic is performed to detect whether the output data of the following column address has an error. It is possible to output at high speed by examining whether it is necessary to correct output data like this in a previous cycle. Output processing and judging processing to be corrected may be performed at the same cycle when the high-speed output is not required.

In the second above-mentioned embodiment, it can facilitate to activate and deactivate the error correction circuit as described in the first embodiment. It can facilitate the output of the check data and the parity data.

Figure 25:
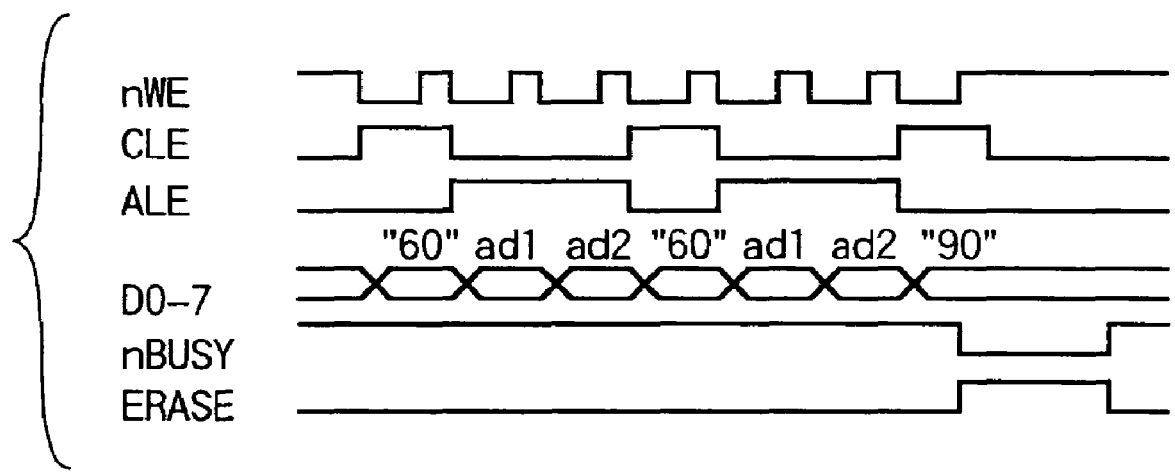
FIG. 25 is a figure, which shows an example of timing of erase operation in flash memory of the present invention.

FIG. 25 shows an example of the timing of the data erase operation in the flash memory according to the first embodiment and the second embodiment.

Here, a case, that the memory blocks from each array A and B of memory cell array 12 are selected one by one, and two blocks are erased at the same time, is shown.

When the hexadecimal code "60"H, which is an erasure address input instruction, is input at raise of write enable signal nWE in the period when command latch enable signal CLE is "H". Continuously, and the address data is taken twice in the period address latch enable signal ALE is "H". When the hexadecimal code "60"H, which is an erasure address input instruction, is input at raise of write enable signal nWE in the period when command latch enable signal CLE is "H", continuously, and the address data is taken twice in the period address latch enable signal ALE is "H". When only one block is erased, the input of the erasure address input instruction "60"H of the second times and the input of the address are not performed.

When the hexadecimal code "90"H, which is an erasure instruction, is input at raise of write enable signal nWE in the period when command latch enable signal CLE is "H", erase instruction signal ERASE becomes "H", and the selected block is erased. Busy signal nBUSY is "L", and preparation of the output to the external device is informed when erasure instruction signal ERASE is "H".

In the above-mentioned explanation, though the check data and the parity data are treated separately to easily understand the present invention, the parity data is one of the check data to check the level of the error.

In each embodiment mentioned above, though the data with two bits is written to one memory cell, 1-bit, 3-bits, and 4-bits. etc. may be written to one memory cell.

Additionally, it is possible to execute the present invention by modifying within the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flash memory comprising:
   a memory sector with a plurality of flash memory cells;
   a plurality of data memory circuits which temporarily memorize data read from said memory sector, said data including uncorrected data;
   a data buffer, which outputs said uncorrected data read from said plurality of data memory circuits to an external device;
   an error correcting circuit that receives said uncorrected data from said plurality of data memory circuits and performs a calculation of a syndrome;
   said error correcting circuit correcting at least some of said uncorrected data when an error has been detected in said uncorrected data based on the calculated syndrome; and
   said data buffer outputting corrected data to said external device.

2. The flash memory according to claim 1, further comprising a status output circuit which outputs an error state to the external device.

3. The flash memory according to claim 1, further comprising an error position arithmetic circuit.

4. The flash memory according to claim 1, wherein said error correcting circuit reverses said uncorrected data based on the calculated syndrome during outputting the uncorrected data to said data buffer in order to obtain a corrected data and outputs said corrected data to said external device from said data buffer.

5. A method of correcting an error in a flash memory comprising:
   reading uncorrected data from a memory sector with a plurality of flash memory cells;
   temporarily memorizing said uncorrected data read from said memory sector in a plurality of data memory circuits;
   receiving said uncorrected data at a data buffer and an error correcting circuit;
   outputting said uncorrected data to an external device from said data buffer and performing a calculation of a syndrome in said error correcting circuit;
   reading said uncorrected data from said plurality of data memory circuits;
   correcting at least some of said uncorrected data when an error has been detected in said uncorrected data based on the calculated syndrome and outputting corrected data to said data buffer; and
   receiving corrected data at said data buffer and outputting said corrected data to said external device from said data buffer.

6. The method according to claim 5, further comprising:
   outputting an error state to said external device from a status output circuit.

7. The method according to claim 5, further comprising:
   performing error position arithmetic.

8. The method according to claim 5, further comprising:
   reversing said uncorrected data based on the calculated syndrome during outputting the uncorrected data to said data buffer in order to obtain a corrected data and outputting said corrected data to said external device from said data buffer.

* * * * *